(12) United States Patent
Osada

(10) Patent No.: US 7,490,010 B2
(45) Date of Patent: Feb. 10, 2009

(54) DATA COLLECTION METHOD, SUBSTRATE PROCESSING APPARATUS, AND SUBSTRATE PROCESSING SYSTEM

(75) Inventor: Shin Osada, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/774,777

(22) Filed: Jul. 9, 2007

(65) Prior Publication Data

US 2008/0040061 A1 Feb. 14, 2008

Related U.S. Application Data

(60) Provisional application No. 60/837,914, filed on Aug. 16, 2006.

(30) Foreign Application Priority Data

Aug. 8, 2006 (JP) .............................. 2006-215730

(51) Int. Cl.
*G06F 19/00* (2006.01)
*G01N 1/00* (2006.01)

(52) U.S. Cl. ........................... 702/34; 702/82; 702/127; 700/108; 700/121; 700/223

(58) Field of Classification Search .................. 702/34, 702/82, 127; 700/108, 121, 223, 110; 714/25
See application file for complete search history.

(56) References Cited

U.S. PATENT DOCUMENTS

| 7,113,838 | B2 * | 9/2006 | Funk et al. | .................. 700/108 |
| 2005/0171627 | A1 * | 8/2005 | Funk et al. | .................. 700/121 |
| 2007/0219664 | A1 * | 9/2007 | Yasukawa et al. | ........... 700/223 |

FOREIGN PATENT DOCUMENTS

| JP | 11-87323 | 3/1999 |
| JP | 2004-39952 | 2/2004 |

\* cited by examiner

*Primary Examiner*—Tung S Lau
*Assistant Examiner*—Hien X Vo
(74) *Attorney, Agent, or Firm*—Oblon, Spivak, McClelland, Maier & Neustadt, P.C.

(57) ABSTRACT

When measurement data collected with a specific sampling cycle by MCs from measuring instrument units are stored into a data storage apparatus, a sampling controller adjusts the sampling cycle to a longer setting if the apparatus state is other than a substrate processing execution state (e.g., an idling state) compared to the sampling cycle set in the substrate processing execution state, so as to minimize the volume of data stored into the data storage apparatus.

4 Claims, 16 Drawing Sheets

FIG.6

| APPARATUS STATE | SAMPLING CYCLE |
|---|---|
| IDLING | TA |
| SUBSTRATE PROCESSING EXECUTION | TB |

FIG.10

| APPARATUS STATE | SAMPLING CYCLE |
|---|---|
| IDLING | TA |
| SUBSTRATE PROCESSING EXECUTION | TB |
| STARTUP | TC |

FIG.13

| APPARATUS STATE | SAMPLING CYCLE |
|---|---|
| IDLING (PRE-ERROR) | TA1 |
| IDLING (POST-ERROR) | TA2 |
| SUBSTRATE PROCESSING EXECUTION (PRE-ERROR) | TB1 |
| SUBSTRATE PROCESSING EXECUTION (POST-ERROR) | TB2 |
| STARTUP | TC |

FIG.16

| APPARATUS STATE | SAMPLING CYCLE | | | |
|---|---|---|---|---|
| | PROCESSING CHAMBER 200A | PROCESSING CHAMBER 200B | PROCESSING CHAMBER 200C | PROCESSING CHAMBER 200D |
| IDLING (PRE-ERROR) | TAA1 | TBA1 | TCA1 | TDA1 |
| IDLING (POST-ERROR) | TAA2 | TBA2 | TCA2 | TDA2 |
| SUBSTRATE PROCESSING EXECUTION (PRE-ERROR) | TAB1 | TBB1 | TCB1 | TDB1 |
| SUBSTRATE PROCESSING EXECUTION (POST-ERROR) | TAB2 | TBB2 | TCB2 | TDB2 |
| STARTUP | TAC | TBC | TCC | TDC |

DATA COLLECTION METHOD, SUBSTRATE PROCESSING APPARATUS, AND SUBSTRATE PROCESSING SYSTEM

CROSS-REFERENCE TO RELATED APPLICATIONS

This document claims priority to Japanese Patent Application Number 2006-215730, filed on Aug. 8, 2006 and U.S. Provisional Application No. 60/837,914, filed on Aug. 16, 2006, the entire content of which are hereby incorporated by reference.

FIELD OF THE INVENTION

The present invention relates to a data collection method, a substrate processing apparatus and a substrate processing system.

BACKGROUND OF THE INVENTION

Various types of substrate processing apparatuses are employed in semiconductor production to execute specific types of processing on target substrates undergoing the processing (hereafter may be simply referred to as "substrates"), such as semiconductor wafers and FPD (flat-panel display) substrates. For instance, a plasma processing apparatus is utilized to execute etching, film formation processing or the like with plasma generated over a substrate placed on a stage inside a processing chamber by raising a process gas supplied into the processing chamber to plasma as high-frequency power is applied to an electrode disposed inside the processing chamber.

Various parameters are set in such a processing apparatus so as to control or monitor its operating conditions. Various types of processing are executed in the processing apparatus under optimal conditions by controlling or monitoring the parameters. Such parameters include control data used to control the processing chamber internal temperature, the electrode temperature, the processing chamber internal pressure and the process gas flow rate, optical data used to ascertain the plasma state and electrical data provided from a matcher that matches the impedance at the electrode with the impedance at the high-frequency power source. During the substrate processing, the substrate processing apparatus is controlled by monitoring the individual parameters with corresponding measuring instruments so as to assure that the optimal processing is executed at all times.

Patent reference Japanese Laid Open Patent Publication No. H11-87323 (literature 1) and Japanese Laid Open Patent Publication No. 2004-39952 (literature 2) listed below disclose technologies whereby a plurality of process parameters are analyzed, any changes in the process characteristics or the system characteristics are detected by statistically correlating these parameters as analysis data and the analysis data are corrected based upon the extent to which the detection value fluctuates. There is also a method disclosed in the related art through which the plurality of parameters are compiled into several types of statistical data to be used as analysis data by adopting the method of principal component analysis, which is a type of multivariate analysis method, and the operating conditions of the processing apparatus are monitored and evaluated based upon the statistical data.

A substrate processing apparatus such as that described above may assume any of various apparatus states during substrate processing. For instance, the substrate processing apparatus engaged in continuous processing through which a plurality of substrates are continuously processed in a batch, may assume a substrate processing execution state during which the plurality of substrates are being continuously processed or an idling state waiting for the start of the continuous processing to be executed on the next batch of substrates after the completion of the continuous processing on the preceding batch. The other states that may be assumed in the substrate processing apparatus include a startup state following the apparatus assembly, a replacement-imminent state, in which a part in the substrate processing apparatus needs to be replaced soon, and an error state in which an abnormality has occurred in the apparatus.

As many as several tens of types of parameters are set and thus, the volume of the parameter data provided by the measuring instruments in the substrate processing apparatus is very large. Another factor resulting in the very large data volume in the related art is that since the parameter data corresponding to the various parameters are collected from the individual measuring instruments over fixed sampling cycles (e.g., 0.1 sec) regardless of the specific state the apparatus is currently in. A problem thus arises in that the storage capacity of the data storage means (e.g., a hard disk) where these data are saved becomes quickly depleted.

In addition, the data that must be analyzed in the event of an error in the substrate processing apparatus are mainly those collected while executing substrate processing. The presence of a large volume of data having been collected while the substrate processing apparatus was not engaged in the substrate processing, e.g., while the substrate processing apparatus was in the idling state, saved in the data storage means, leads to another concern that the data needed for the error analysis cannot be retrieved quickly. Furthermore, since no substrate is actually processed while the substrate processing apparatus is in the idling state, it is not necessary to collect a large volume of data in the idling state as long as no error has occurred in the substrate processing apparatus.

The storage capacity in the data storage means may be used more efficiently by lengthening the sampling cycle with which the data are obtained from the measuring instruments and thus reducing the volume of sampled data. However, if the sampling cycle is shortened regardless of the apparatus state, the volume of data collected while, for instance, the substrate processing is in progress will also be reduced. When it becomes necessary to analyze such data, the data analysis accuracy may be compromised. There is another factor to be considered in that it is more desirable to use a data storage means with a smallest possible storage capacity so as to minimize the manufacturing cost.

SUMMARY OF THE INVENTION

Accordingly, an object of the present invention, having been completed by addressing the issues discussed above, is to provide a data collection method and the like, with which the volume of data stored in the data storage means can be minimized and thus, the storage capacity in the data storage means can be used with maximum efficiency without lowering the data analysis accuracy.

The object described above is achieved in an aspect of the present invention by providing a data collection method to be adopted in a substrate processing apparatus that includes a processing chamber where a specific type of processing is executed on a processing target substrate and collects data provided by a plurality of measuring instruments disposed, at least, in the processing chamber, comprising a step in which measurement data are obtained from the measuring instruments with a predetermined sampling cycle and are stored into a data storage means. The data collection method is characterized in that the sampling cycle is adjusted based upon the state of the substrate processing apparatus.

The object described above is also achieved in another aspect of the present invention by providing a substrate processing apparatus that includes a processing chamber where a specific type of processing is executed on a processing target substrate, comprising a plurality of measuring instruments disposed, at least, in the processing chamber, a sampling means for obtaining measurement data from the measuring instruments with a predetermined sampling cycle, a data storage means for storing the measurement data, a sampling cycle storage means for storing in advance sampling cycles each corresponding to one of various states that may be assumed in the substrate processing apparatus and a sampling control means for executing control so as to adjust the sampling cycle to the sampling cycle obtained from the sampling cycle storage means based upon the specific state currently assumed in the substrate processing apparatus.

According to the present invention described above, the sampling cycle is adjusted in correspondence to the state of the substrate processing apparatus, and thus, the volume of data that are collected can be reduced compared to the volume of data sampled with the fixed cycle at all times. Since this allows the sampling cycle to be adjusted so that data that is not necessarily vital for data analysis or the like are collected in a smaller volume, wasteful use of storage capacity in the data storage means is minimized without lowering the accuracy of the data analysis. Furthermore, by setting an optimal sampling cycle in correspondence to each of the states that may be assumed in the substrate processing apparatus and executing data analysis with the data thus sampled with the optimal sampling cycle, an even higher level of accuracy is assured with regard to the analysis results.

In addition, it is desirable that a decision be made as to whether or not the substrate processing apparatus is currently in a substrate processing execution state and that a longer sampling cycle than the sampling cycle selected in the substrate processing execution state be set if the substrate processing apparatus is not in the substrate processing execution state (e.g., if the substrate processing apparatus is in an idling state). The measures described above enable data collection whereby data less crucial for data analysis or the like (e.g., data collected in the idling state) are collected in a smaller volume compared to data more crucial for data analysis or the like (e.g., data collected in the substrate processing execution state). As a result, wasteful use of storage capacity in the data storage means is minimized without compromising the data analysis accuracy.

It is also desirable that when the substrate processing apparatus is in an apparatus startup state instead of the substrate processing execution state, a sampling cycle at least equal to or shorter than the sampling cycle set for the substrate processing execution state be selected. By adopting these measures, it is ensured that a sufficient volume of data is collected when the substrate processing apparatus is not in the substrate processing execution state but in a state in which the likelihood of an occurrence of apparatus trouble is high and thus the likelihood of the need for data analysis is high, i.e., in the apparatus startup state. For instance, by adjusting the sampling cycle for the apparatus startup state equal to the sampling cycle for the substrate processing execution state, the accuracy of the data analysis executed in the event of apparatus trouble will be maintained at a desirable level. Alternatively, the sampling cycle for the apparatus startup state may be set shorter than the sampling cycle for the substrate processing execution state so as to improve the data analysis accuracy by increasing the volume of collected data.

The object described above is also achieved in yet another aspect of the present invention by providing a substrate processing apparatus that includes a processing chamber where a specific type of processing is executed on a processing target substrate, comprising a plurality of measuring instruments disposed, at least, in the processing chamber, a sampling means for obtaining measurement data from the measuring instruments with a predetermined sampling cycle, a data storage means for storing the measurement data, a data analysis means for analyzing the measurement data stored in the data storage means and a sampling control means for executing control so as to adjust the sampling cycle based upon analysis results provided by the data analysis means.

The object described above is further achieved in yet another aspect of the present invention by providing a substrate processing system, comprising a substrate processing apparatus, equipped with a processing chamber where a specific type of processing is executed on a processing target substrate and a plurality of measuring instruments disposed, at least, in the processing chamber, and a data processing apparatus that processes data provided from the plurality of measuring instruments, with the substrate processing apparatus and the data processing apparatus connected with each other via a network. The substrate processing apparatus in the substrate processing system includes a sampling means for obtaining measurement data from the measuring instruments with a predetermined sampling cycle and a communication means for transmitting the obtained measurement data to the data processing apparatus via the network, whereas the data processing apparatus in the substrate processing system includes a communication means for receiving the measurement data originating from the substrate processing apparatus, a data storage means for storing the received measurement data, a data analysis means for analyzing the measurement data stored in the data storage means and a sampling control means for executing control so as to adjust the sampling cycle based upon analysis results provided by the data analysis means.

According to the present invention described above, the sampling cycle is adjusted based upon the analysis results provided by the data analysis means and thus, the volume of collected data can be reduced compared to the volume of data sampled with a cycle that is fixed at all times. This, in turn, minimizes wasteful use of storage capacity in the data storage means.

The object described above is achieved in another aspect of the present invention by providing a data collection method to be adopted in a substrate processing apparatus that includes a processing chamber where a specific type of processing is executed on a processing target substrate and collects data provided by a plurality of measuring instruments disposed, at least, in the processing chamber, comprising a step in which measurement data are obtained from the measuring instruments with a predetermined sampling cycle and are stored into a data storage means. The data collection method is characterized in that the measurement data stored in the data storage means are analyzed, that a decision is made as to whether or not the substrate processing apparatus is in an error state based upon the analysis results and that the sampling cycle is shortened over the sampling cycle set for a non-error state if the substrate processing apparatus is judged to be in the error state.

According to the present invention described above, the sampling cycle is adjusted based upon the analysis results provided by the data analysis means and thus, the volume of collected data can be reduced compared to the volume of data sampled with a cycle that is fixed at all times. This, in turn, minimizes wasteful use of storage area in the data storage means. In addition, if the substrate processing apparatus is judged to be in the error state, the measurement data are sampled with a shorter sampling cycle and thus, a greater volume of data, compared to the volume of data collected in the non-error state, can be gathered. As a result, the conditions of the substrate processing apparatus in the error state can be analyzed in detail, assuring even better data analysis accuracy.

The object described above is achieved in yet another aspect of the present invention by providing a data collection method to be adopted in a substrate processing apparatus that includes a processing chamber where a specific type of processing is executed on a processing target substrate and collects data provided by a plurality of measuring instruments disposed, at least, in the processing chamber, comprising a step in which measurement data are obtained from the measuring instruments with a predetermined sampling cycle and are stored into a data storage means. The data collection method is characterized in that the measurement data stored in the data storage means are analyzed, that the state of the substrate processing apparatus is estimated based upon the analysis results and that the sampling cycle is adjusted based upon the estimate results.

According to the present invention described above, the sampling cycle is adjusted based upon the estimate results and thus, the volume of collected data can be reduced compared to the volume of data sampled with a cycle that is fixed at all times. This, in turn, minimizes wasteful use of storage area in the data storage means.

In this data collection method, the measurement data stored in the data storage means may be analyzed so as to, for instance, estimate the extent of wear of a part disposed within the processing chamber based upon the analysis results and make a decision as to whether or not the estimated wear extent exceeds a predetermined threshold value. It is desirable that if the wear extent is determined to exceed the threshold value, the sampling cycle be shortened relative to the sampling cycle set when the wear extent does not exceed the threshold value. Through these measures, a greater volume of data is sampled so as to estimate the part wear extent more accurately as part replacement time approaches.

The object described above is also achieved in another aspect of the present invention by providing a data collection method to be adopted in a substrate processing apparatus that includes a plurality of processing chambers where processing target substrates are processed and collects data from a plurality of measuring instruments disposed, at least, in each of the processing chambers, comprising a step in which measurement data are obtained from the measuring instruments in each processing chamber with a predetermined sampling cycle and are stored into a data storage means. The data collection method is characterized in that the measurement data stored in the data storage means are analyzed and the sampling cycle is adjusted in correspondence to each of the processing chambers based upon the analysis results.

In this method, the measurement data stored in the data storage means may be analyzed so as to make a decision as to whether or not each processing chamber is in an error state based upon the analysis results and to shorten the sampling cycle for a particular processing chamber in the error state, compared to the sampling cycle set in a non-error state. Alternatively, the measurement data stored in the data storage means may be analyzed so as to estimate the state of each processing chamber based upon the analysis results and to adjust the sampling cycle for the processing chamber based upon the estimate results.

According to the present invention adopted in a substrate processing apparatus with a plurality of processing chambers, the sampling cycle is adjusted in correspondence to each of the processing chambers, allowing data to be collected with the optimal cycle for the particular processing chamber. For instance, in a substrate processing apparatus where different types of processing are executed in the individual processing chambers, the data needed to analyze the condition of each type of processing alone can be collected. Since the volume of collected data can be kept to the absolute minimum, more efficient use of the storage area in the data storage means is assured.

The object described above is further achieved in yet another aspect of the present invention by providing a substrate processing system comprising a substrate processing apparatus equipped with a processing chamber where a specific type of processing is executed on a processing target substrate and a plurality of measuring instruments disposed, at least, in the processing chamber, a data processing apparatus that processes data provided from the plurality of measuring instruments and a host computer with the substrate processing apparatus, the data processing apparatus and the host computer connected with one another via a network. The substrate processing apparatus in the substrate processing system includes a sampling means for obtaining measurement data from the measuring instruments with a predetermined sampling cycle and a communication means for transmitting the obtained measurement data to the data processing apparatus via the network, whereas the data processing apparatus in the substrate processing system includes a communication means for receiving a signal from the host computer and the measurement data originating from the substrate processing apparatus, a data storage means for storing the received measurement data, and a sampling control means for executing control so as to adjust the sampling cycle based upon the state of the substrate processing apparatus judged based upon the signal provided by the host computer.

According to the present invention, the sampling control means judges the state of the substrate processing apparatus based upon the signal from the host computer. Thus, integrated sampling cycle management for the entire substrate processing system is enabled via the host computer.

According to the present invention, the volume of data collected for purposes of data analysis and the like can be kept down to an absolute minimum and wasteful use of storage capacity in the data storage means can be minimized without lowering the data analysis accuracy.

BRIEF DESCRIPTION OF THE DRAWINGS

FIG. 6 shows the contents of the data table stored in the sampling cycle storage means in the data processing apparatus shown in FIG. 4;

FIG. 10 shows the contents of the data table stored in the sampling cycle storage means in the data processing apparatus achieved in the embodiment;

FIG. 13 shows the contents of the data table stored in the sampling cycle storage means in the data processing apparatus achieved in a third embodiment of the present invention;

FIG. 16 shows the contents of the data table stored in the sampling cycle storage means in the data processing apparatus achieved in a fourth embodiment of the present invention.

DETAILED DESCRIPTION OF THE PREFERRED EMBODIMENTS

Figure 1:
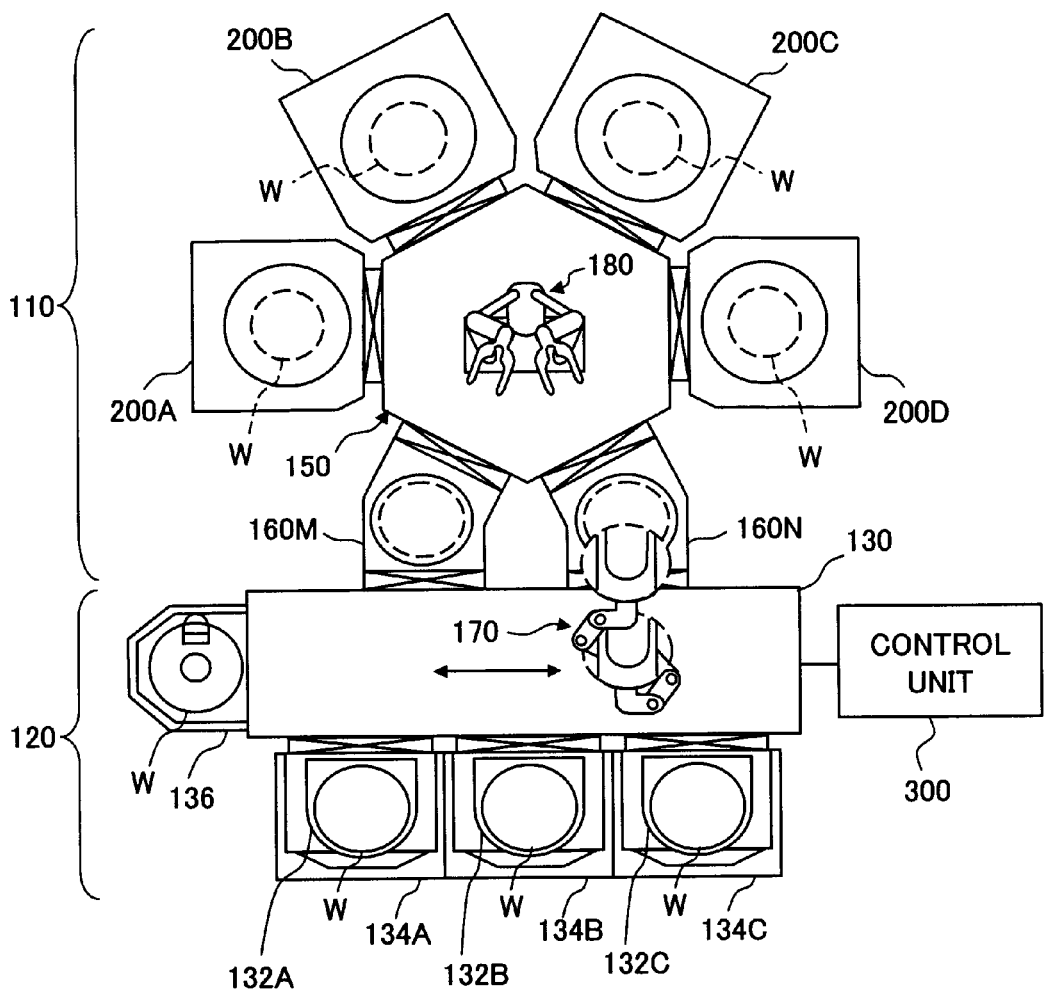
FIG. 1 is a plan view schematically illustrating the structure adopted in the substrate processing apparatus achieved in the first embodiment of the present invention.

The following is a detailed explanation of preferred embodiments of the present invention, given in reference to the attached drawings. It is to be noted that in the specification and the drawings, the same reference numerals are assigned to components having substantially identical functions and structural features to preclude the necessity for a repeated explanation thereof.

Structural Example Adopted in Substrate Processing Apparatus Achieved in First Embodiment First, the substrate processing apparatus achieved in the first embodiment of the present invention is explained in reference to a drawing. FIG. 1 schematically shows the structure adopted in the substrate processing apparatus in the first embodiment of the present invention. The substrate processing apparatus 100 comprises a processing unit 110 where various types of processing such as film formation and etching are executed on processing target substrates which may be, for instance, semiconductor wafers (hereafter may be simply referred to as "wafers") W and a transfer unit 120 that transfers the wafers W to/from the processing unit 110.

As shown in FIG. 1, the transfer unit 120 includes a transfer chamber 130 via which wafers are transferred between cassette containers 132 (132A~132C) representing an example of a substrate storage container and the processing unit 110. The transfer chamber 130 assumes a box shape with a substantially polygonal section (e.g., rectangular). A plurality of cassette stages 134 (134A~134C) are disposed side-by-side on one side of the transfer chamber 130. The cassette containers 132A~132C can be placed on the cassette stages 134A~134C respectively.

The cassette containers 132 (132A~132C) each has a capacity for housing up to, for instance, 25 wafers W stacked with uniform pitches. The cassette containers adopt a sealed structure with their inner space filled with, for instance, an $N_2$ gas atmosphere. The wafers W can be transferred between the transfer chamber 130 and the cassette containers 132A~132C via a gate valve. It is to be noted that the quantities of the cassette stages 134 and the cassette containers 132 are not limited to those presented in the example illustrated in FIG. 1.

An orienter (pre-alignment stage) 136 to function as a positioning device is disposed at an end of the transfer chamber 130. This orienter 136 aligns a wafer W by detecting an orientation flat, a notch or the like in the wafer W.

Inside the transfer chamber 130, a transfer unit-side transfer mechanism (transfer chamber internal transfer mechanism) 170, which transfers a wafer W along the longer side of the transfer chamber (along the direction indicated by the arrow shown inside the transfer chamber 130 in FIG. 1) via, for instance, a linear drive mechanism is disposed. The transfer unit-side transfer mechanism 170 operates based upon a control signal provided by a control unit 300 to be detailed later. It is to be noted that the transfer unit-side transfer mechanism 170 may be a double-arm mechanism with two end effectors such as that shown in FIG. 1, or it may be a single-arm mechanism with a single end effector.

Next, an example of a structure that may be adopted in the processing unit 110 is explained. The processing unit 110 in, for instance, a cluster tool-type substrate processing apparatus may include a plurality of processing chambers 200 (first through fourth processing chambers 200A through 200D) and load-lock chambers 160M and 160N, all connected with a high level of airtightness around a common transfer chamber 150 formed so as to have a polygonal section (e.g., a hexagonal section), as shown in FIG. 1.

In each of the processing chambers 200A through 200D, a specific type of processing such as film formation processing (e.g., plasma CVD processing) or etching (e.g. plasma etching processing) is executed on a wafer W. Gas delivery systems (not shown in FIG. 1) through which specific types of gases to be used as a process gas and a purge gas can be delivered into the individual processing chambers 200A through 200D and discharge systems (not shown in FIG. 1) through which the gasses in the processing chambers 200A through 200D can be discharged are connected to the processing chambers 200A through 200D. It is to be noted that a structural example that may be adopted in the processing chambers 200A through 200D is to be described in detail later. In addition, the number of processing chambers 200 in the substrate processing apparatus is not limited to that in the example shown in FIG. 1.

The common transfer chamber 150 has a function of transferring wafers W between the individual processing chambers 200A through 200D described above and/or between the processing chambers 200A through 200D and the first and second load-lock chambers 160M and 160N. The common transfer chamber 150 has a polygonal section (e.g., hexagonal). The processing chambers 200 (200A through 200D), which are disposed around the common transfer chamber, are each connected with the common transfer chamber via a gate valve and the front ends of the first and second load-lock chambers 160M and 160N are each connected with the common transfer chamber via a gate valve (a vacuum pressure-side gate valve). The base ends of the first and second load-lock chambers 160M and 160N are connected to the other side surface of the transfer chamber 130 each via a gate valve (an atmospheric pressure-side gate valve).

The first and second load-lock chambers 160M and 160N have a function of temporarily holding wafers W and passing them onto subsequent processing phases after pressure adjustment. Inside each of the first and second load-lock chambers 160M and 160N, a transfer stage on which a wafer can be placed is disposed.

At the processing unit 110 structured as described above, the passages between the common transfer chamber 150 and the individual processing chambers 200A through 200D and the passages between the common transfer chamber 150 and the individual load-lock chambers 160M and 160N can be opened/closed while assuring a high level of airtightness, thereby achieving a cluster-tool structure that allows communication with the common transfer chamber 150 as necessary. In addition, the passages between the transfer chamber 130 and the first and second load-lock chambers 160M and 160N, too, can be opened/closed while assuring airtightness.

Inside the common transfer chamber 150, a processing unit-side transfer mechanism (common transfer chamber internal transfer mechanism) 180 constituted with articulated arms capable of flexing, moving up/down and rotating, for instance, is disposed. This processing unit-side transfer mechanism is used to transfer wafers W from the load-lock chambers 160M and 160N to the individual processing chambers 200A through 200D and vice versa. The processing unit-side transfer mechanism 180 is driven based upon a control signal provided by the control unit 300. It is to be noted that the processing unit-side transfer mechanism 180 may be a double-arm mechanism with two end effectors such as that shown in FIG. 1, or it may be a single-arm mechanism with a single end effector.

The substrate processing apparatus 100 includes the control unit 300 that controls the overall operations of the substrate processing apparatus 100, including control of the transfer unit-side transfer mechanism 170, the processing unit-side transfer mechanism 180, the various gate valves and the orienter 136. An example of a structure that may be adopted in such a control unit 300 is explained later.

Structural Example for Processing Chambers

Figure 2:
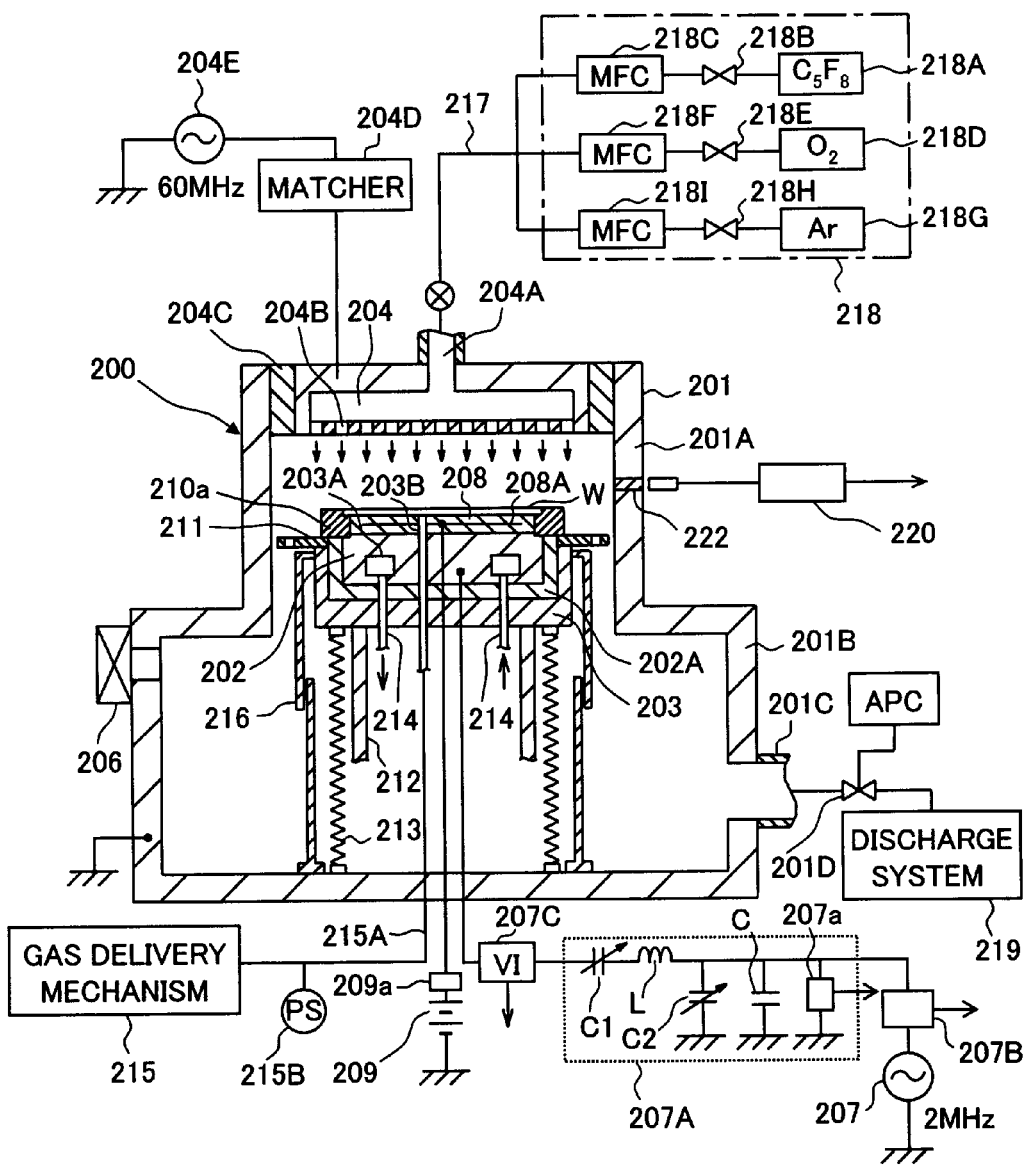
FIG. 2 is a block diagram presenting a structural example that may be adopted in the processing chamber and their peripheral devices in the embodiment.

In reference to a drawing, an example of a structure that may be adopted in the processing chambers 200A through 200D is explained. FIG. 2 presents a block diagram of a structural example that may be adopted in the processing chambers 200A through 200D and their peripheral devices. It is assumed that the processing chambers 200A through 200D adopt structures identical to one another and the explanation is given on a representative processing chamber 200 without attaching a letter A, B, C or D to reference numerals for the components so as to avoid reference to any specific processing chamber among the processing chambers 200A through 200D. In other words, the processing chamber 200 may be any of the processing chambers 200A through 200D.

As shown in FIG. 2, the processing chamber 200, in which a processing container 201 constituted of, for instance, aluminum, is disposed, houses therein an aluminum supporting member 203 supporting a lower electrode 202 via an insulator 202A, which is allowed to move up/down, and a showerhead 204 disposed above the supporting member 203, through which a process gas is supplied. The showerhead 204, which also functions as an upper electrode, is electrically isolated from the side walls of the processing chamber 200 via an insulator 204C. In the following description, the showerhead 204 may be referred to as the upper electrode 204.

A first high-frequency power source 204E is connected to the upper electrode 204 with a matcher 204B inserted in the feeder line. Electric power in a frequency range of 50~150 MHz is output from the first high-frequency power source 204E. By applying power with such a high frequency to the upper electrode 204, very dense plasma can be formed inside the processing chamber 200 in a desirable state of dissociation, which, in turn, enables plasma processing to be executed under low-pressure conditions. It is desirable to set the output frequency from the first high-frequency power source 204E to 50~80 MHz, and typically, the frequency is set to 60 MHz, as shown in the figure, or a setting close to 60 MHz.

A detection window 222 is located at a side wall of the processing chamber 200, and an optical measurement unit 220 such as a spectroscope for detecting plasma light emission inside the processing chamber 200 via the detection window 222 is disposed outside the processing chamber 200 beyond the side wall thereof.

The processing chamber 200 is constituted with an upper chamber 201A assuming a small diameter, which is located on the upper side in the processing container 201 and a lower chamber 201B assuming a large diameter, which is located on the lower side in the processing container 201. A transfer port through which a wafer W is carried into/out of the processing chamber is formed near the top of the lower chamber 201B with a gate valve 206 mounted at the transfer port.

A second high-frequency power source 207 is connected to the lower electrode 202 via an electrical measurement unit 207C such as a VI probe, a matcher 207A, a power meter (measuring instrument) 207B. The second high-frequency power source 207 outputs power in a frequency range of several hundred kHz~several tens of megahertz. By applying power in such a frequency range to the lower electrode 202, the optimal ionization effect can be achieved without damaging the wafer W undergoing the processing. The frequency of the power output from the second high-frequency power source 207 is typically set to 2 MHz, as shown in the figure. It is to be noted that high-frequency power with the frequency set to 2 MHz is output from the second high-frequency power source 207 in the embodiment. In addition to the 2 MHz frequency power, waves with frequencies which are integral multiples of the fundamental wave, constituted with the 2 MHz frequency power (e.g., 4 MHz, 8 MHz, 10 MHz and the like) are applied to the lower electrode 202.

The matcher 207A, which may include, for instance, a capacitor C, variable capacitors C1 and C2 and a built-in coil L, matches the impedance at the lower electrode 202 with the impedance at the second high-frequency power source 207 by adjusting the variable capacitors C1 and C2. In addition, a detector (not shown) that measures a high-frequency (RF) voltage Vpp on the side where the lower electrode 202 is present (on the high-frequency voltage output side) is installed in the matcher 207A. The matcher 207A is further equipped with a voltmeter (measuring instrument) 207a which measures a voltage Vdc at a point between the feeder line (power line) through which the second high-frequency power is supplied and the ground of the processing chamber 200.

The second high-frequency power output from the second high-frequency power source 207 is measured at the power meter 207B. In addition, high-frequency voltages (V), high-frequency currents (I), high-frequency phases (P) and impedances (Z) in the fundamental wave (e.g., the advancing wave and the reflected wave of the high-frequency power) and a higher harmonic wave, attributable to the plasma generated in the upper chamber 201A, are detected as the electrical measurement unit 207C measures the high-frequency power applied to the lower electrode 202.

An electrostatic chuck 208 is disposed on the upper surface of the lower electrode 202, with a DC power source 209 connected to an electrode plate 208A of the electrostatic chuck 208. As a high voltage is applied to the electrode plate 208A from the DC power source 209 under high vacuum conditions, the wafer W becomes electrostatically held onto the electrostatic chuck 208. A power meter 209a that detects the current and the voltage applied to the electrostatic chuck 208 is connected at a point between the electrode plate 208A of the electrostatic chuck 208 and the DC power source 209.

At the outer circumference of the lower electrode 202, a focus ring 210a is disposed so as to gather the plasma generated within the upper chamber 201A into the area around the wafer W. A gas transfer ring 211, mounted atop the supporting member 203, occupies a space under the focus ring 210a. A plurality of holes are formed with equal intervals along the circumferential direction over the entire circumference of the gas transfer ring 211, and the gas in the upper chamber 201A moves into the lower chamber 201B via these holes.

As a ball screw mechanism 212 and a bellows 213 are engaged in operation, the supporting number 203 moves up/down between the upper chamber 201A and the lower chamber 201B. When delivering a wafer W onto the lower electrode 202, the supporting member 203 moves downward so as to lower the lower electrode 202 down to the lower chamber 201B and then the gate valve 206 is opened so that the processing unit-slide transfer mechanism (common transfer chamber internal transfer mechanism) 180 (see FIG. 1) in the common transfer chamber 150 is able to deliver the wafer W onto the lower electrode 202. It is to be noted that a bellows cover 216 is disposed over the exterior of the bellows 213.

A coolant passage 203A connected to coolant piping 214, is formed inside the supporting member 203. The temperature of the wafer W is controlled to stay at a predetermined level by circulating a coolant through the coolant passage 203A via the coolant piping 214.

A gas flow passage 203B is formed to extend over the supporting member 203, the insulator 202A, the lower electrode 202 and the electrostatic chuck 208. A gas delivery mechanism 215 supplies a backside gas such as a He gas with a predetermined pressure into a narrow clearance between the electrostatic chuck 208 and the wafer W via a gas piping 215A. The He gas thus supplied improves the thermal conductivity between the electrostatic chuck 208 and the wafer W. The pressure of the backside gas is detected with a pressure meter 215B. A mass flow controller (not shown,) for instance, is installed at the gas delivery mechanism 215 so as to control the backside gas flow rate by detecting the gas flow rate via the mass flow controller.

A gas delivery unit 204A is formed at the upper surface of the upper electrode 204 and a process gas delivery system 218 is connected to the gas delivery unit 204A via a piping 217. The process gas delivery system 218 includes a $C_5F_8$ gas supply source 218A, an $O_2$ gas supply source 218D and an Ar gas supply source 218G.

From the gas supply sources 218A, 218D and 218G, the corresponding gases are delivered to the upper electrode 204 at the predetermined flow rates via valves 218B, 218E and 218H and mass flow controllers 218C, 218F and 218I respectively. As a result, a mixed gas achieving a specific mixing ratio is supplied to the upper electrode 204. A plurality of holes 204B are formed with equal intervals over the entire lower surface of the upper electrode 204 and the mixed gas to be used as the process gas is supplied into the upper chamber 201A from the upper electrode 204 via the holes 204B.

The processing chamber 200 is connected to a discharge system 219 constituted with a vacuum pump and the like via a discharge pipe 201C. An APC (auto pressure controller) valve 201D is mounted at the discharge pipe 201C so as to automatically adjust the degree of openness of the APC valve in correspondence to the gas pressure inside the processing chamber 200.

Structural Example for Control Unit

Figure 3:
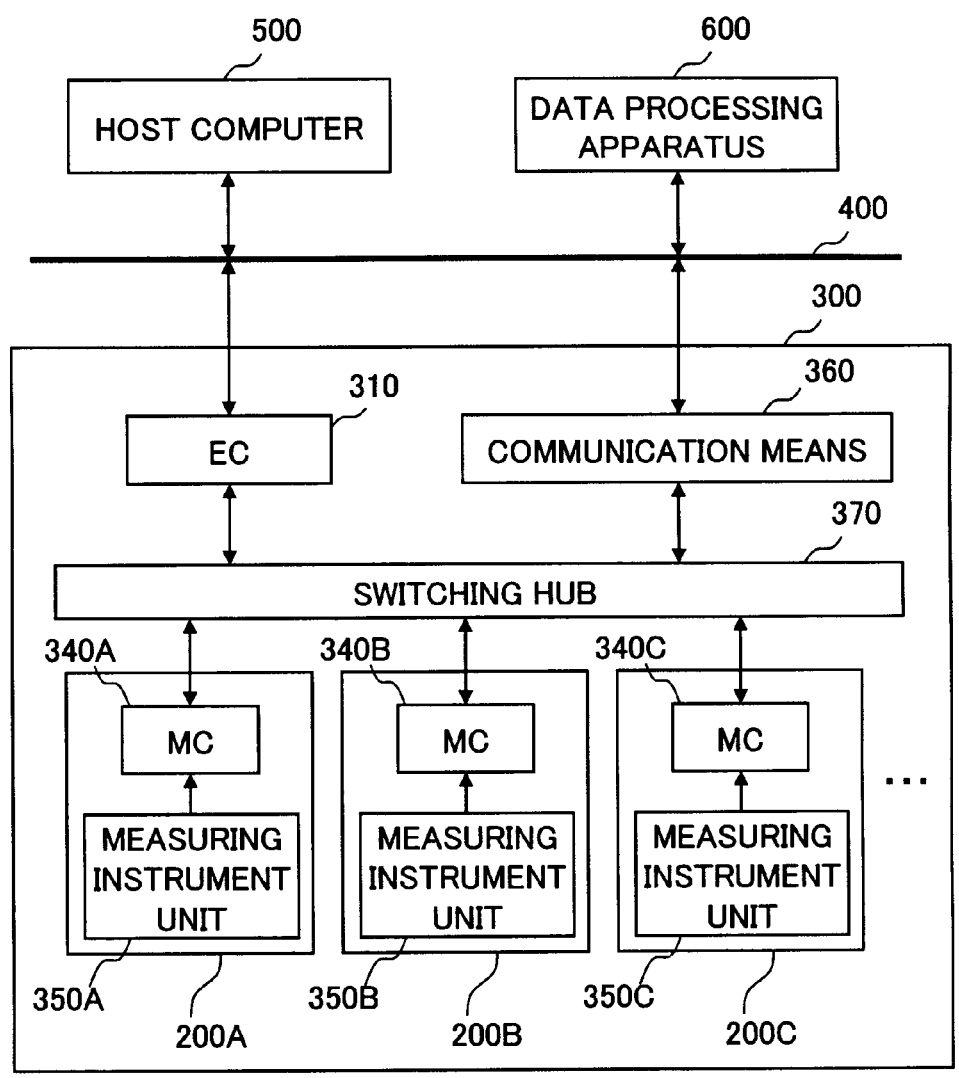
FIG. 3 is a block diagram showing the structure adopted in the control unit of the substrate processing apparatus shown in FIG. 1.

A structural example that may be adopted in the control unit 300 of the substrate processing apparatus 100 is explained in reference to a drawing. FIG. 3 is a block diagram showing a structure that may be adopted in the control unit 300. As shown in the figure, the control unit 300 includes an equipment control unit (hereafter referred to as an "EC: equipment controller") 310, a plurality of module control units (hereafter referred to as "MCs: module controllers") 340A, 340B, 340C, . . . measuring instrument units 350A, 350B, 350C, . . . a communication means (communication interface) 360 and a switching hub 370 connecting the various components to one another.

The EC 310 constitutes a main control unit (master control unit) that controls the overall operations of the substrate processing apparatus 100 by supervising the MCs 340A, 340B, 340C, . . . . For instance, the EC 310 may comprise a CPU (central processing unit) constituting the EC main unit, a RAM (random access memory) that includes a memory area to be used by the CPU when it executes various types of data processing, a display means constituted with a liquid crystal display or the like, at which operation screens and selection screens are brought up on display, an input/output means via which the operator is able to enter various types of data such as process recipes and data to be edited and various types of data such as a process recipe and a processed log can be output to a specific storage medium, an alerting means, such as an alarm (e.g., a buzzer), for alerting the personnel to any error such as an electrical leak occurring in the substrate processing apparatus 100, and a communication means (communication interface) for communicating with an external apparatus such as a host computer 500. The EC 310 also includes a storage means for storing processing programs in conformance to which various types of processing are executed in the substrate processing apparatus 100 and information needed when executing the processing programs.

The MCs 340A, 340B, 340C, . . . constitute sub control units (slave control units) that control the operations of the individual modules including the transfer chamber 130, the orienter 136, the loadlock chambers 160M and 160N, the common transfer chamber 150 and the processing chambers 200A~200D in the substrate processing apparatus 100.

The MCs 340A, 340B, 340C, . . . have a function of sampling signals generated as the respective measuring instrument units 350A, 350B, 350C, . . . execute measurement (hereafter referred to as "measurement signals") with a predetermined cycle.

The measuring instrument units 350A, 350B, 350C, . . . installed in correspondence to the individual modules, provide signals obtained through measurement that indicate the states of the modules and the states of wafers W present in the modules. The MCs 340A, 340B, 340C, . . . respectively sample the measurement signals provided from the measuring instrument units 350A, 350B, 350C, . . . and transmit sampling data obtained through the sampling operation, i.e., measurement data (hereafter may be simply referred to as "data") to the communication means 360.

The communication means 360 of the substrate processing apparatus 100 is electrically connected with a data processing apparatus 600 via a network 400 which may be a LAN (local area network). Various types of data are exchanged between the communication means 360 and the data processing apparatus 600 based upon a specific protocol such as the TCP/IP. The sampling data provided from, for instance, the individual MCs 340A, 340B, 340C, . . . are transmitted from the communication means 360 to the data processing apparatus 600.

The host computer 500 executes the overall management of the manufacturing processes executed in the plant where the substrate processing apparatus 100 is installed. The host computer 500 is connected to the EC 310 within the control unit 300 of the substrate processing apparatus 100 via the network 400. The EC 310 includes a communication means, e.g., an HCI (host communication interface), to function as a logical interface with the host computer 500, and various types of data are exchanged between the HCI and the host computer 500 in conformance to a specific protocol such as the TCP/IP. It is to be noted that the communication means may adopt a structure other than that described above. The configuration described above enables the host computer 500 to control the substrate processing apparatus 100 via the EC 310 as well. In addition, the host computer 500 sets cassette containers at the cassette stages 134A~134C in the substrate processing apparatus 100 by controlling an automatic transfer vehicle (not shown).

The sampling data received from the communication means 360 are stored in the data processing apparatus 600 which also executes various types of arithmetic processing by using the sampling data. In addition, the data processing apparatus 600 controls the data sampling operations executed by the individual MCs 340A, 340B, 340C, . . . within the control unit 300.

Figure 4:
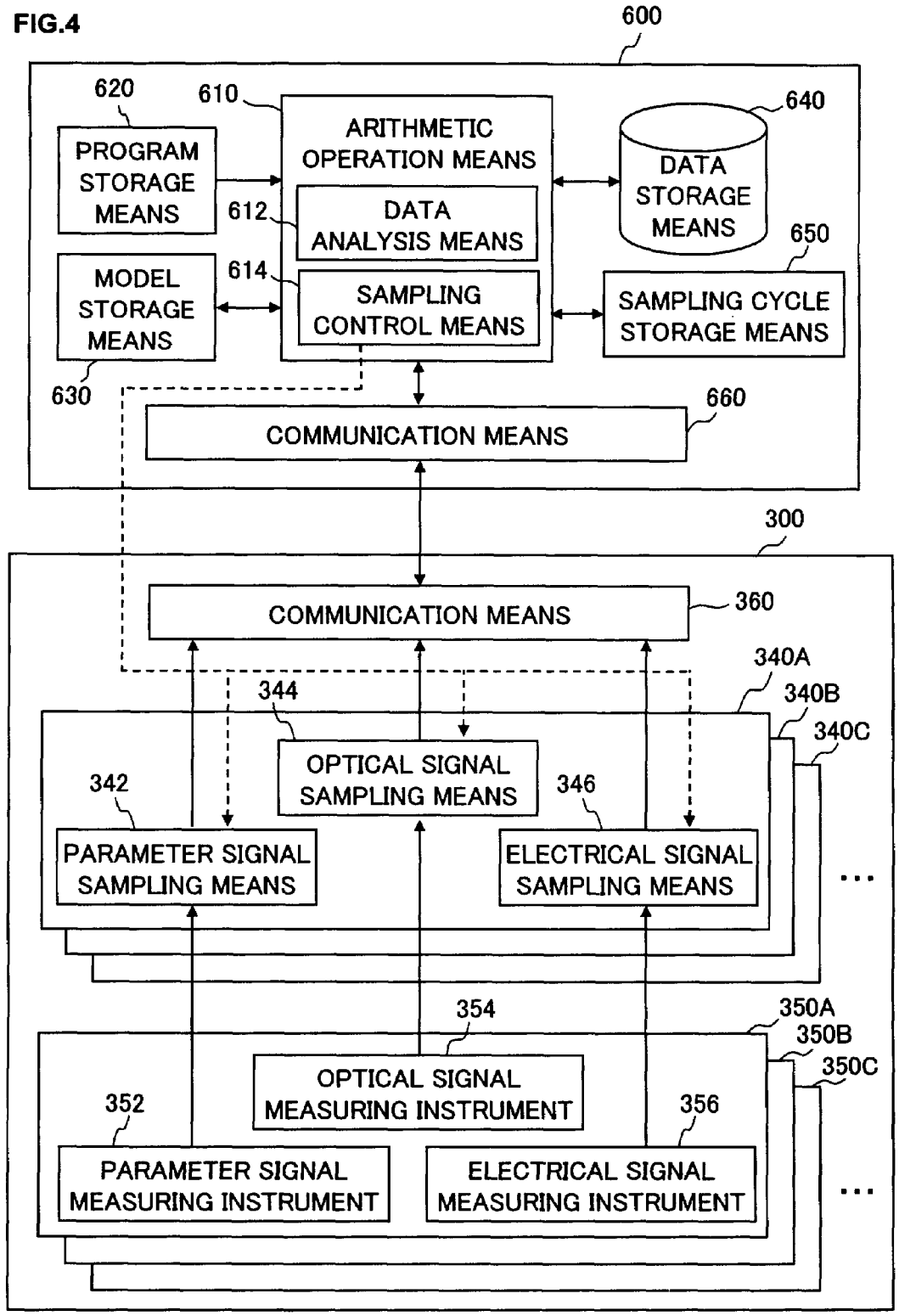
FIG. 4 is a block diagram showing the structure adopted in the data processing apparatus in the embodiment.

Structural Examples for Data Processing Apparatus MCs and Measuring Instrument Unit Structural examples that may be adopted in the data processing apparatus 600, the MCs 340A, 340B, 340C, . . . and the measuring instrument units 350A, 350B, 350C, . . . are now explained in reference to a drawing. FIG. 4 is a block diagram showing specific examples that may be adopted. The following is an explanation of the individual structural examples, given in a sequence matching the flow of the measurement data and the sampling data.

As shown in FIG. 4, the measuring instrument units 350A, 350B, 350C, . . . may each be constituted with a parameter signal measuring instrument unit 352, an optical signal measuring instrument unit 354 and an electrical signal measuring instrument unit 356. The parameter signal measuring instrument unit 352 measures controllable parameters such as the flow rate of the process gas delivered into the processing chamber 200 in the substrate processing apparatus 100 and the pressure inside the processing chamber 200 and the high-frequency power applied to at least either of the electrodes facing opposite each other in the processing chamber 200. In addition, a specific example of the optical signal measuring instrument unit 354, which obtains through measurement optical signals indicating the plasma spectrum and the like, to be used to ascertain the state of the plasma having been generated in the processing chamber 200, is the optical measurement unit 220. The electrical signal measuring instrument unit 356 obtains through measurement electrical signals indicating the state of the substrate processing apparatus 100, and more specifically, the electrical signal measuring instrument includes the electrical measurement unit 207C, the power meter 207B and the voltmeter 207A connected to the lower electrode 202 in the processing chamber 200 and the power meter 209a connected at a point between the electrode plate 208A of the electrostatic chuck 208 and the DC power source 209.

The measurement signals used in the embodiment include signals indicating the gas flow rates measured via the individual mass flow controllers 218C, 218F and 218I, a signal indicating the degree of openness of the APC valve 201D, a current application signal and a voltage application signal indicating the current and the voltage applied to the electrostatic chuck 208, which are detected by the power meter 209a, a signal indicating the backside gas pressure detected by the pressure meter 215B, a signal indicating a measurement value obtained at the matcher 207A (e.g., a measurement value indicating the positions assumed in the variable capacitors C1 and C2 in the matched state or the voltage Vdc measured at a point between the high-frequency power feeder line (power line) and the ground), a signal indicating a measurement value provided by the electrical measurement unit 207C (e.g., a measurement value indicating the advancing wave and the reflected wave of the high-frequency power) and a light emission spectrum signal, a light emission intensity signal and the like indicating the state of plasma inside the processing chamber 200, which is detected by the optical measurement unit 220.

Each MC among the MCs 340A, 340B, 340C, . . . equipped with a parameter signal sampling means 342, an optical signal sampling means 344 and an electrical signal sampling means 346, obtains sampling data by sampling the signals having been obtained through measurement executed at the corresponding measuring instrument unit 350A, 350B, 350C, . . . . For instance, the parameter signal sampling means 342 of the MC 340A samples parameter signals obtained through the measurement executed at the parameter signal measuring instrument unit 352 in the measuring instrument unit 350A. Likewise, the optical signal sampling means 344 in the MC 340A samples the optical signal obtained through the measurement executed by the optical signal measuring instrument unit 354 in the measuring instrument unit 350A and the electrical signal sampling means 346 in the MC 340A samples the electrical signals obtained through the measurement executed by the electrical signal measuring instrument unit 356 in the measuring instrument unit 350A.

The sampling data thus obtained by the MCs 340A, 340B, 340C, . . . are transmitted to the communication means 360 by the individual MCs. The communication means 360, in turn, processes the received sampling data in conformance to a specific communication protocol such as the TCP/IP and then transmits the sampling data to the data processing apparatus 600. It is to be noted that the MCs 340A, 340B, 340C, . . . may each include a data communication means so as to enable the individual MCs 340A, 340B, 340C, . . . to directly transmit the data to the data processing apparatus 600. However, the number of MCs 340A, 340B, 340C, . . . mounted in the control unit 300 is bound to be significant in the substrate processing apparatus 100 having many processing chambers. Under such circumstances, it is more desirable to provide a single communication means 360 for controlling the data communication between the MCs 340A, 340B, 340C, . . . and the data processing apparatus 600, as in the embodiment, so as to assure efficient data communication that reflects the traffic conditions in the network 400 and the volume of data being transmitted.

The data processing apparatus 600 that receives the sampling data from the control unit 300 described above includes an arithmetic operation means 610, a program storage means 620, a model storage means 630, a data storage means 640, a sampling cycle storage means 650 and a communication means 660. It is to be noted that the data processing apparatus 600 may be constituted with a computer. The arithmetic operation means 610 may be an arithmetic operation unit such as a CPU (central processing unit) and the functions of a data analysis means 612 and a sampling control means 614, at least, must be fulfilled by the CPU.

The data analysis means 612 statistically processes the various types of sampling data transmitted from the communication means 360 in the control unit 600 and received at the communication means 660, determines the correlation existing among the individual types of data and prepares a model to be used to estimate the state of the substrate processing apparatus 100 or the wafer processing state based upon the correlation. The data analysis means 612 then estimates the state of the substrate processing apparatus 100 or the wafer processing state based upon the model thus prepared and the sampling data having been received from the control unit 300. In addition, the data analysis means 612 makes a decision based upon the sampling data having been received from the control unit 300 as to whether or not the state of the substrate processing apparatus or the wafer processing state is normal. The data analysis means 612 then provides the estimate results and the decision-making results to the EC 310 in the control unit 300 via the communication means 660. Based upon the estimate results or the decision-making results, the EC 310 continues with the current operation in the substrate processing apparatus 100, makes necessary adjustments in the operation or interrupts the operation.

The sampling control means 614 controls the sampling operations executed by the parameter signal sampling means 342, the optical signal sampling means 344 and the electrical signal sampling means 346 in the individual MCs 340A, 340B, 340C, . . . so as to sample the measurement data by adjusting the sampling cycle based upon the operating state of the substrate processing apparatus 100 or the data analysis results provided by the data analysis means 612. The method adopted by the sampling control means 614 when executing the sampling control is to be described in detail later.

In the program storage means 620, arithmetic operation programs such as multivariate analysis programs or single variant analysis programs executed by the data analysis means 612, a sampling control program executed by the sampling control means 614 and the like are stored.

In the model storage means 630, the model prepared by the data analysis means 612 is stored. When estimating the state of the substrate processing apparatus 100 or the wafer processing state, the data analysis means 612 reads out the model from the model storage means 630 and executes arithmetic operation processing based upon the model thus read out.

The program storage means 620 and the model storage means 630 may each be constituted with a recording means such as a semiconductor memory, or they may be constituted with separate memory areas allocated in a recording means such as a hard disk.

In the data storage means 640, the sampling data transmitted from the communication means 360 in the control unit 300 and received at the communication means 660 are stored. It is desirable to use a storage means that enables random access, assures a high access speed and has a large capacity, e.g., a hard disk, as the data storage means 640.

In the sampling cycle storage means 650, a plurality of sets of sampling cycle data are stored. The sampling control means 614 reads out a specific set of sampling cycle data from the sampling cycle storage means 650 and controls the parameter signal sampling means 342, the optical signal sampling means 344 and the electrical signal sampling means 346 so as to sample the measurement data with the cycle indicated by the sampling cycle data having been read out. The sampling cycle storage means 650 may be constituted with a storage means such as a semiconductor memory, or it may be constituted as a specific memory area designated in the data storage means 640, e.g., a hard disk.

The communication means 660, electrically connected with the communication means 360 at the control unit 300 via the network 400, receives the sampling data and transmits control signals output by the sampling control means 314.

The multivariate analysis is executed in the embodiment by adopting the partial least square method (hereafter referred to as the "PLS method") and the principal component analysis method (hereafter referred to as the "PCA method"). The multivariate analysis is executed by adopting the PLS method to estimate the state of the substrate processing apparatus 100, estimate the extent of wear of a part installed in the substrate processing apparatus 100, estimate the results of wafer processing and the like. In addition, the multivariate analysis is executed by adopting the PCA method to detect an error occurring in the substrate processing apparatus 100 and the like.

A specific example of the PLS method is described in the Journal of Chemometrics, vol. 2 (pp 211~228) (1998). In the PLS method, a plurality of plasma-related parameters are designated as explanatory variants, a plurality of control parameters and apparatus state parameters are designated as target variants and a model expression (an estimating expression or a correlation expression such as a recurrent expression), as indicated in (1) below, which correlates the two types of variants. In the model expression in (1) below, X represents the matrix of the explanatory variants and Y represents the matrix of the explained variants (estimated values). In addition, B represents a recurrent matrix made up with explanatory variant coefficients (weights), whereas E represents a residual matrix.

$$Y=BX+E \qquad (1)$$

The PLS method is advantageous in that when numerous explanatory variants and explained variants are present in both matrices X and Y, a relational expression indicating the relationship between X and Y can be determined as long as there are several values obtained through actual measurement in the matrices. Furthermore, the PLS method assures high levels of stability and reliability even if the relational expression is obtained based upon a small number of measured values.

The data analysis means 612 in the embodiment reads out a PLS processing program from the program storage means 620, processes the data used as the explanatory variants and the target variants through the procedure indicated in the program and obtains expression (1). Once expression (1) is obtained, the data analysis means 612 is able to estimate the target variants by applying the data used as the explanatory variants into the matrix X. The estimated values thus obtained assure a high level of reliability.

In the PCA method, a few characteristic parameters are synthesized based upon data constituted with numerous parameters and the data are then analyzed based upon the synthesized parameters (principal components). The PCA method is considered to be highly effective when adopted to ascertain the state of a substrate processing apparatus such as the substrate processing apparatus 100 in the embodiment with a large number of parameters, including the plasma-related parameters, the control parameters and the apparatus state parameters, set as parameters indicating the state of the substrate processing apparatus.

The data analysis means 612 in the embodiment reads out a PCA processing program from the program storage means 620, executes data analysis through PCA for the numerous parameters, calculates an index such as a residual sum of squares, a principal component point or a sum of squares of principal component points and thus detects an error occurring in the substrate processing apparatus 100.

States Assumed in the Substrate Processing Apparatus

In reference to a drawing, the apparatus states that may be assumed in the substrate processing apparatus 100 are explained. The apparatus states that may be assumed in the substrate processing apparatus 100 are primarily divided into a substrate processing execution state in which wafer processing is in progress and a non-substrate processing execution state. The non-substrate processing execution state includes an idling state assumed while the substrate processing apparatus waits in standby for wafer processing and an apparatus startup state assumed while the substrate processing apparatus is primed so as to enter a wafer processing-enabled state. In reference to the embodiment the idling state is explained as an example of the non-substrate processing execution state.

Figure 5:
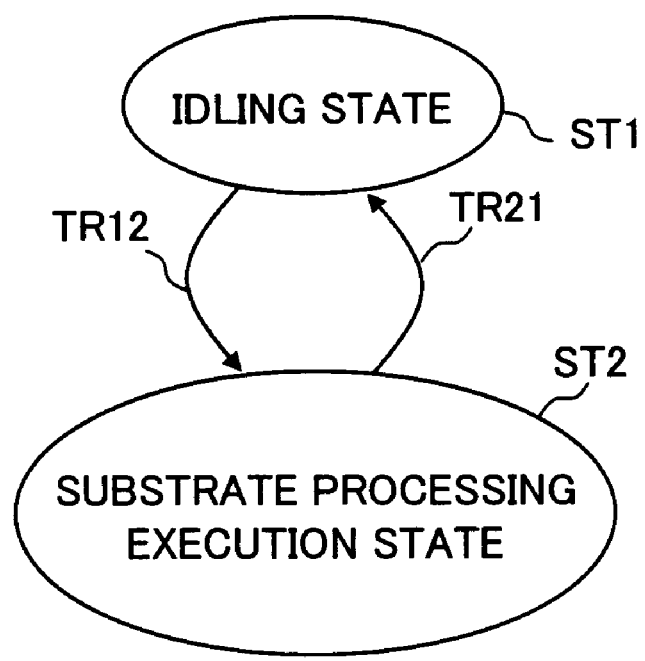
FIG. 5 is a transition diagram with regard to the state of the substrate processing apparatus achieved in the embodiment.

FIG. 5 is a transition diagram with regard to the states assumed in the substrate processing apparatus 100 in the embodiment. In reference to the embodiment, an idling state ST1 and a substrate processing execution state ST2 are examined as apparatus states assumed in the substrate processing apparatus 100 as shown in FIG. 5.

The substrate processing apparatus 100 in the idling state ST1 is waiting in standby for a cassette container holding wafers W to undergo processing to be set. As a cassette container is set at one of the cassette stages 134A~134C or cassette containers are set at all the cassette stages in the idling state ST1, the apparatus state of the substrate processing apparatus 100 shifts from the idling state ST1 to the substrate processing execution state ST2 (TR12). The cassette containers are each carried to the substrate processing apparatus 100 by an automatic transfer vehicle (not shown) and set at a cassette stage in response to, for instance, a command issued by the host computer 500.

The sampling control means 614 makes a decision based upon information provided by the substrate processing apparatus 100 or the host computer 500 as to whether or not the apparatus state currently assumed in the substrate processing apparatus 100 is the substrate processing execution state ST2. Such information provided by the substrate processing apparatus 100 may indicate whether or not a cassette container has been set at a cassette stage among the cassette stages 134A~134C. More specifically, the EC 310 detects the presence of cassette containers via sensors (not shown) installed at the cassette stages 134A~134C. Once the presence of a cassette container at a given cassette stage is detected, the EC 310 transmits a detection signal to the sampling control means 614. Upon receiving the detection signal, the sampling control means 614 judges that the state of the substrate processing apparatus 100 has shifted from the idling state ST1 to the substrate processing execution state ST2.

In addition, the information provided to the sampling control means by the host computer 500 may be a transfer command issued by the host computer 500 to transfer a cassette container on the automatic transfer vehicle. The sampling control means 614 is able to determine based upon this transfer command that the state of the substrate processing apparatus 100 has shifted from the idling state ST1 to the substrate processing execution state ST2. The sampling control means 614 may check whether or not a transfer command has been issued by the host computer 500 and may judge that the state of the substrate processing apparatus 100 has shifted from the idling state ST1 to the substrate processing execution state ST2 when a transfer command is detected.

It is to be noted that each time the state of the substrate processing apparatus 100 shifts, either the host computer 500 or the substrate processing apparatus 100 may transmit apparatus state data indicating the post-shift apparatus state to the sampling control means 614. In this case, the sampling control means 614 is able to judge the apparatus state assumed in the substrate processing apparatus 100 based upon the apparatus state data thus provided.

The operation executed when the substrate processing apparatus 100 is in the substrate processing execution state ST2 is now explained. First, the transfer unit-side transfer mechanism 170 takes a wafer W out of one of the cassette containers 132A~132C and carries it to the orienter 136. The wafer W is positioned at the orienter 136 and subsequently, the wafer W is carried into the loadlock chamber 160M or 160N. If a completely processed wafer W having undergone all the necessary processing is present in the loadlock chamber 160M or 160N at this point, the unprocessed wafer W is carried into the loadlock chamber after the completely processed wafer W is first taken out of the loadlock chamber.

Next, the unprocessed wafer W in the loadlock chamber 160M or 160N is transferred by the processing unit-side transfer mechanism 180 into the processing chamber, e.g., the processing chamber 200A, where the wafer W is to undergo processing. In the processing chamber 200A, the wafer W undergoes a specific type of processing. The processed wafer W resulting from the processing executed in the processing chamber 200A is carried out of the processing chamber 200A by the processing unit-side transfer mechanism 180. If the wafer is to undergo a series of processing continuously at a plurality of processing chambers 200, the wafer is carried into another processing chamber 200, e.g., the processing chamber 200B, where it is to undergo the next process.

Once all the processing to be executed on the wafer W is completed, the completely processed wafer is returned to the initial cassette container among the cassette containers 132A~132C by reversing the initial transfer procedure. When the processing on all the target wafers W is completed and the processed wafers W are put back in their initial cassette containers 132A~132C, the EC 310 notifies the host computer 500 that the wafer processing has ended. Upon receiving the notice, the host computer 500 issues a command for the automatic transfer vehicle to transfer the cassette containers 132A~132C from out of the substrate processing apparatus 100.

Once the cassette containers 132A~132C are carried out of the substrate processing apparatus 100 by the automatic transfer vehicle, i.e., once the cassette containers 132A~132C are removed from the cassette stages 134A~134C, the substrate processing apparatus 100 shifts back into the idling state ST1 (TR 21). It is to be noted that the sampling control means 614 determines that the substrate processing apparatus 100 has shifted from the substrate processing execution state ST2 to the idling state ST1 based upon information provided by the substrate processing apparatus 100 or the host computer 500 in much the same way as that explained earlier.

Sampling Cycles

Now, the sampling cycles assumed in the first embodiment are explained in reference to a drawing. In the sampling cycle storage means 650 achieved in the first embodiment, data sampling cycles, each set in correspondence to one of the states that the substrate processing apparatus 100 may assume as described above, are stored. The sampling cycles may be set by the operator via, for instance, a data input means (not shown) in the data processing apparatus 600 or they may be set via the host computer 500.

FIG. 6 shows a data table indicating the relationship between the sampling cycle and the apparatus state, stored in the sampling cycle storage means 650. As shown in FIG. 6, a sampling cycle TA (e.g., 1 sec) is set in correspondence to the idling state ST1, whereas a sampling cycle TB (e.g., 100 msec) is set in correspondence to the substrate processing execution state ST2. The sampling cycles may be set by the operator via, for instance, a data input means (not shown) in the data processing apparatus 600 or they may be set via the host computer 500.

Specific Example of Data Collection Processing

Figure 7:
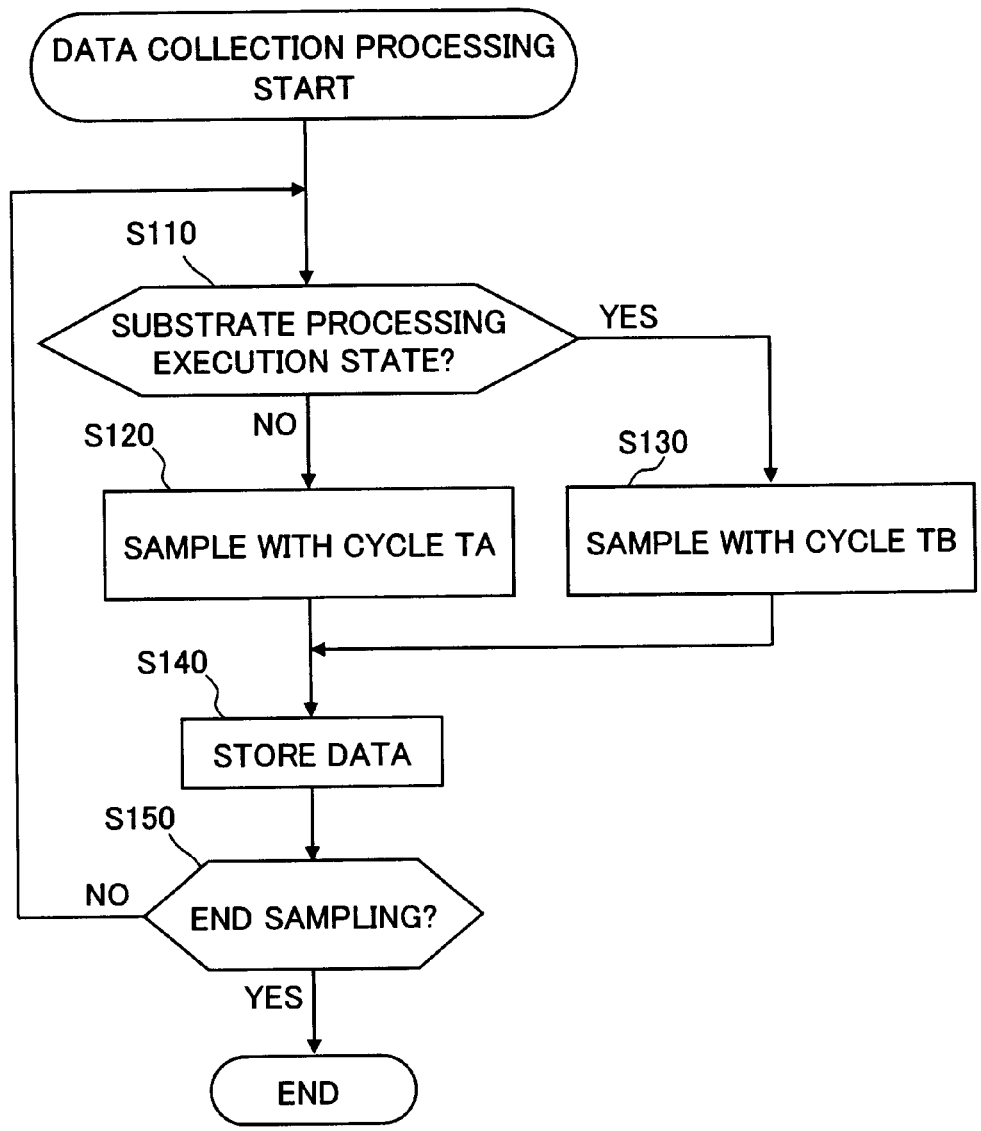
FIG. 7 presents a flowchart of an example of data collection processing that may be executed in the embodiment.

Next, a specific example of data collection processing that may be executed in the embodiment is explained in reference to drawings. FIG. 7 presents a flowchart of the specific example of the data collection processing executed in the embodiment. The data collection processing is executed by the arithmetic operation means 610 in the data processing apparatus 600 based upon a specific program. Once the data collection processing starts, the sampling control means 614 first executes control for adjusting the sampling cycle in correspondence to the state of the substrate processing apparatus 100 (steps S110, S120 and S130).

More specifically, a decision is made in step S110 as to whether or not the substrate processing apparatus 100 is currently in the substrate processing execution state. If it is decided that the substrate processing apparatus 100 is not in the substrate processing execution state ST2, e.g., if the substrate processing apparatus is judged to be in the idling state ST1 described earlier, the sampling cycle storage means 650 is accessed in step S120 to read out the sampling cycle TA corresponding to the idling state ST1.

Then, the sampling control means 614 transmits a control signal to the individual MCs 340A, 340B, 340C, . . . so that they sample the measurement signals obtained at the measuring instrument units 350A, 350B, 350C, . . . with the sampling cycle TA. It is to be noted that this control signal is transmitted/received via the communication means 660 at the data processing apparatus 600 and the communication means 360 at the control unit 300.

If, on the other hand, it is decided in step S110 that the substrate processing apparatus is currently in the substrate processing execution state ST2, the sampling cycle storage means 650 is accessed in step S130 to read out the sampling cycle TB corresponding to the substrate processing execution state ST2. Then, the sampling control means 614 transmits a control signal to the individual MCs 340A, 340B, 340C, . . . so that they sample the measurement signals obtained at the measuring instrument units 350A, 350B, 350C, . . . with the sampling cycle TB.

Figure 8:
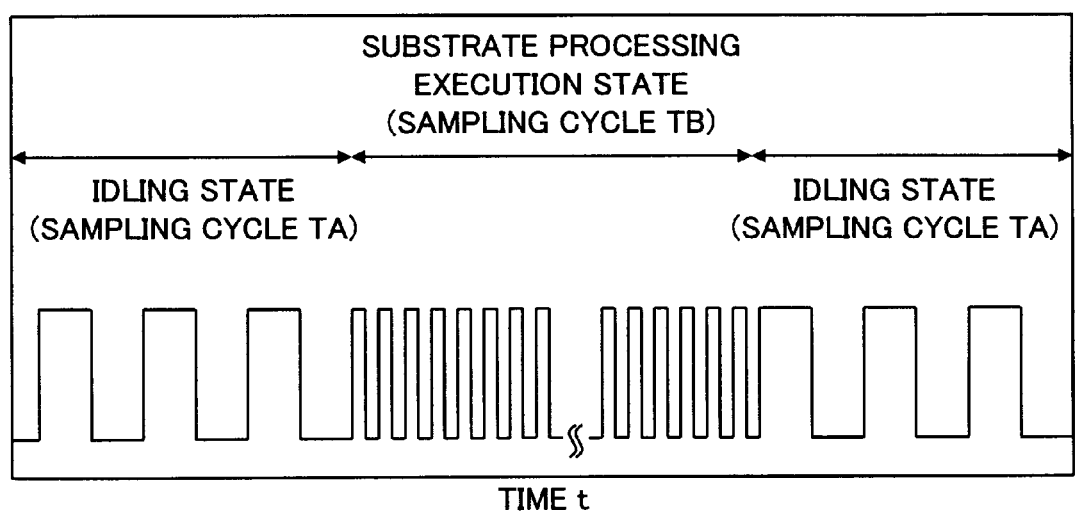
FIG. 8 is a waveform diagram, illustrating the relationship between the state assumed in the substrate processing apparatus shown in FIG. 1 and the sampling cycle.

FIG. 8 presents a waveform diagram indicating the relationship between the state assumed in the substrate processing apparatus 100 and the sampling cycle with which the MCs 340A, 340B, 340C, . . . sample the measurement signals, as observed in the first embodiment. As shown in the figure, the sampling means in each MC sample the measurement signals with the sampling cycle TB (e.g., 100 msec) when the substrate processing apparatus is in the substrate processing execution state ST2 and sample the measurement signals with the sampling cycle TA (e.g., 1 sec) longer than the sampling cycle TB, when the substrate processing apparatus is in the idling state ST1. Thus, it is ensured that a smaller volume of sampling data is collected in the idling state ST1 than in the substrate processing execution state ST2.

The data sampled by the MCs 340A, 340B, 340C, . . . at the substrate processing apparatus 100 are then transmitted by the communication means 360 to the communication means 660 at the data processing apparatus 600 via the network 400. At the data processing apparatus 600, the sampling data received at the communication means 660 are sequentially stored into the data storage means 640 in step S140.

Next, in step S150, a decision is made as to whether or not to end the data collection. For instance, if an operation to stop the substrate processing apparatus 100 has been performed or a substrate processing apparatus OFF command has been issued by the host computer 500 in the event of an apparatus operation termination or for purposes of maintenance, for instance, a decision is made based upon such an operation or a command as to whether or not the data collection processing is to end. If it is decided in step S150 that the data collection is not to end, the operation returns to step S110, whereas if it is decided in step S150 that the data collection is to end, the sequence of data collection processing ends.

The sampling data stored in the data storage means 640, as described above, are used in data analysis executed to judge whether or not an error has occurred in the substrate processing apparatus 100, predict an error, estimate the extent of wear of a part in the substrate processing apparatus 100 and the like, as well as in data analysis executed in the event of an error to determine its cause. Since the volume of data collected in the idling state ST1, which are not very critical analysis data, is reduced without reducing the volume of data collected in the substrate processing execution state ST2, which are essential for accurate data analysis, wasteful use of the storage capacity in the data storage means 640 can be minimized without sacrificing the data analysis accuracy.

In addition, a sampling cycle shorter than that in the related art may be selected as the sampling cycle TB corresponding to the substrate processing execution state ST2, so as to collect a greater volume of data. In such a case, an error occurring in the substrate processing apparatus 100 will be detected sooner and more accurately compared to the related art. Furthermore, the optimal part replacement timing can be estimated. In addition, since the data collected in the substrate processing execution state ST2 are also used to predict the wafer processing results and the like, the wafer processing results can be predicted with a higher level of accuracy by collecting a greater volume of data in the substrate processing execution state ST2.

In contrast, no wafer is actually processed in the idling state ST1 and for this reason, the required error judgment or error prediction can be executed with no problem even though a smaller volume of data is collected in the idling state compared to the volume of data collected in the substrate processing execution state ST2.

According to the present invention, achieved based upon the concept that the importance of the measurement data with regard to data analysis accuracy is judged based upon the apparatus state, the measurement signals are sampled with a specific sampling cycle among different sampling cycles, in correspondence to the state of the substrate processing apparatus 100. As a result, data collection can be executed so that less critical data (e.g., data obtained in the idling state) are collected in a smaller volume compared to critical data (e.g., data obtained in the substrate processing execution state). Thus, wasteful use of the storage capacity in the data storage means 640 can be minimized without sacrificing the data analysis accuracy. In addition, since the optimal sampling cycle can be set in correspondence to a specific state assumed in the substrate processing apparatus, a higher level of accuracy is assured with regard to the analysis results.

Since the volume of data less critical in the data analysis is minimized, the length of time required to retrieve the data to be used in the data analysis can be reduced. Since this, in turn, allows the data analysis to be completed faster, the analysis results can be reflected sooner in the wafer processing and the operations of the substrate processing apparatus 100.

It is to be noted that with the volume of the data less critical for data analysis minimized as described above, a greater storage area for the data more critical for data analysis is secured in the data storage means 640, which allows data going further back in the past to be saved in the data storage means 640. This, in turn, makes it possible to investigate the history of states assumed in the substrate processing apparatus 100 and the history of the wafer processing executed in the past by using data having been collected further back in the past.

Furthermore, since the data more critical for data analysis can be stored in greater volume, an improvement in the data analysis result accuracy can be achieved. For instance, since the extent of part wear can be estimated more accurately, the optimal timing for part replacement can be determined more accurately. Moreover, the state of the substrate processing apparatus 100 can be monitored over a longer period of time. By adopting the present invention, the variance between the characteristics of the substrate processing apparatus 100 and those of other substrate processing apparatuses can be ascertained with ease.

Second Embodiment

Next, the data collection processing executed in the second embodiment is explained in reference to drawings. It is to be noted that since a substrate processing apparatus 100 and a data processing apparatus 600 in the second embodiment assume structures identical to those shown in FIGS. 1 through 4, a detailed explanation thereof is omitted.

Figure 9:
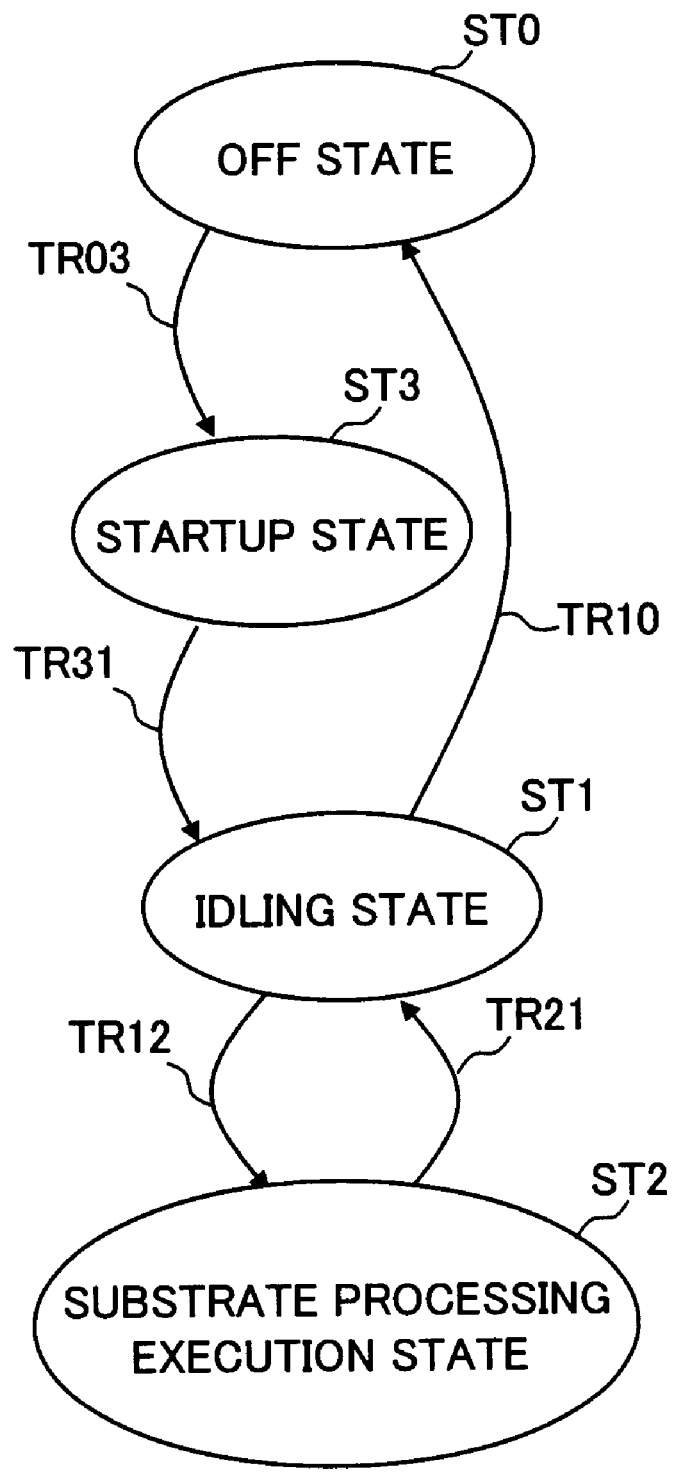
FIG. 9 is a transition diagram with regard to the state of the substrate processing apparatus achieved in a second embodiment.

FIG. 9 presents a transition diagram with regard to apparatus states that may be assumed in the substrate processing apparatus 100 in the embodiment. In the second embodiment, an OFF state ST0 in which the substrate processing apparatus 100 is not engaged in operation and a startup state assumed when the substrate processing apparatus in the OFF state is started up by turning on the power (hereafter simply referred to as the "startup state") are also each considered to be a non-substrate processing execution state.

In the OFF state ST0, the substrate processing apparatus 100 is not engaged in operation and the power is off. It is to be noted that the substrate processing apparatus 100 in the OFF state ST0 may be undergoing maintenance such as repair, inspection or part replacement, with the power turned off.

The substrate processing apparatus 100 in the startup state ST3 may have been started up for the first time for operation by turning on the power or may have been started up after undergoing the maintenance work. The substrate processing apparatus 100 also enters the startup state as it is started up at the factory after the assembly process.

As the power to the substrate processing apparatus 100 in the OFF state ST0 is turned on, the substrate processing apparatus 100 enters the startup state ST3 (TR03), and then shifts into the idling state ST1 (TR 31). For instance, as the power to the substrate processing apparatus 100 in the OFF state ST0 is turned on, the control parameters such as the temperature and the pressure inside the processing chambers are adjusted, thereby starting up the substrate processing apparatus into a wafer processing-enabled state. Subsequently, the substrate processing apparatus 100 shifts into the idling state ST1 to wait in standby for wafer processing.

The sampling control means 614 makes a decision based upon information provided by the substrate processing apparatus 100 or the host computer 500 as to whether or not the substrate processing apparatus 100 is currently in the startup state ST3. This decision as to whether or not the substrate processing apparatus is in the startup state ST3 may be made by checking, for instance, whether or not the power to the substrate processing apparatus 100 has been turned on. In addition, the sampling control means 614 is able to determine that the apparatus state has shifted from the startup state ST3 to the idling state ST1 upon receiving a notice indicating the completion of the control parameter adjustment originating from, for instance, the EC 310, which controls adjustment of the control parameters.

It is to be noted that the other apparatus states and shift conditions are identical to those explained in reference to the first embodiment and, for this reason, their explanation is omitted.

Sampling Cycles

Now, the sampling cycles assumed in the second embodiment are explained in reference to a drawing. In the sampling cycle storage means 650 achieved in the second embodiment, data sampling cycles, each set in correspondence to one of the states that the substrate processing apparatus 100 may assume as described above, are stored as in the first embodiment. FIG. 10 shows a data table indicating the relationship between the sampling cycle and the apparatus state, stored in the sampling cycle storage means 650.

As shown in FIG. 10, a sampling cycle TA (e.g., 1 sec) is set in correspondence to the idling state ST1, a sampling cycle TB (e.g., 100 msec) is set in correspondence to the substrate processing execution state ST2 and a sampling cycle TC (e.g., 100 msec is set in correspondence to the startup state ST3. The sampling cycles may be set by the operator via, for instance, a data input means (not shown) in the data processing apparatus 600 or they may be set via the host computer 500.

Specific Example of Data Collection Processing

Figure 11:
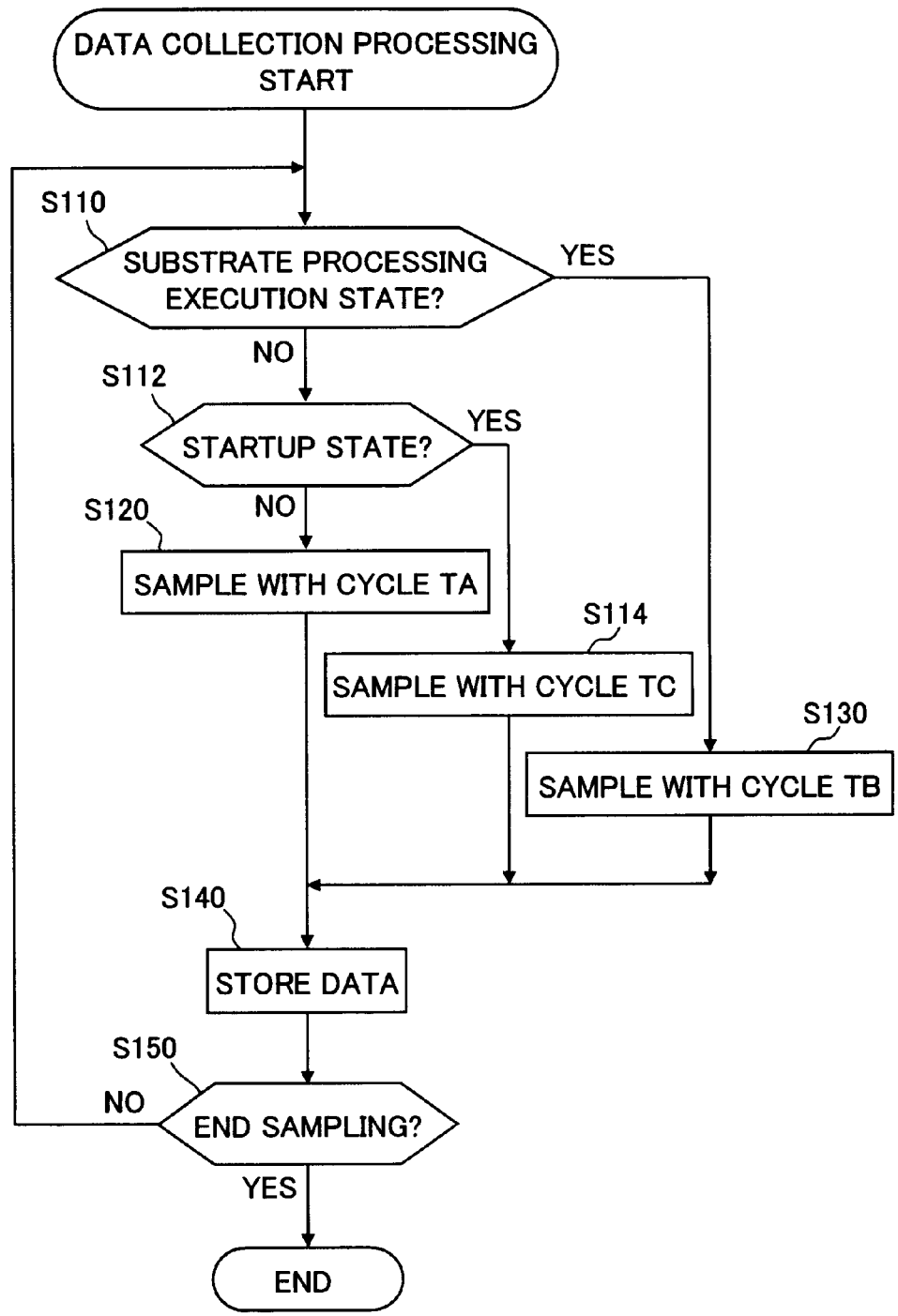
FIG. 11 presents a flowchart of an example of data collection processing that may be executed in the embodiment.

Next, a specific example of data collection processing that may be executed in the embodiment is explained in reference to drawings. FIG. 11 presents a flowchart of the specific example of the data collection processing executed in the embodiment. The data collection processing is executed by the arithmetic operation means 610 at the data processing apparatus 600 based upon a specific program. Once the data collection processing starts, the sampling control means 614 first executes control for adjusting the sampling cycle in correspondence to the state of the substrate processing apparatus 100 (steps S110, S112, S114, S120 and S130).

More specifically, a decision is made in step S110 as to whether or not the substrate processing apparatus 100 is currently in the substrate processing execution state. If it is decided in step S110 that the substrate processing apparatus is not in the substrate processing execution state, a decision is made in step S112 as to whether or not the substrate processing apparatus 100 is currently in the startup state. If it is decided in step S112 that the substrate processing apparatus is currently in the startup state, the sampling cycle storage means 650 is accessed in step S114 to read out the sampling cycle TC corresponding to the startup state ST3. Then, the sampling control means 614 transmits a control signal to the individual MCs 340A, 340B, 340C, . . . so that they sample the measurement signals obtained at the measuring instrument units 350A, 350B, 350C, . . . with the sampling cycle TC.

If, on the other hand, it is decided in step S112 that the substrate processing apparatus is currently not in the startup state, it is judged that the substrate processing apparatus is in the idling state and the sampling cycle storage means 650 is accessed in step S120 to read out the sampling cycle TA corresponding to the idling state ST1. Then, the sampling control means 614 transmits a control signal to the individual MCs 340A, 340B, 340C, . . . so that they sample the measurement signals obtained at the measuring instrument units 350A, 350B, 350C, . . . with the sampling cycle TA.

If it is decided in step S110 that the substrate processing apparatus is in the substrate processing execution state, the sampling cycle storage means 650 is accessed in step S130 to read out the sampling cycle TB corresponding to the substrate processing execution state ST2. Then, the sampling control means 614 transmits a control signal to the individual MCs 340A, 340B, 340C, . . . so that they sample the measurement signals obtained at the measuring instrument units 350A, 350B, 350C, . . . with the sampling cycle TB.

Figure 12:
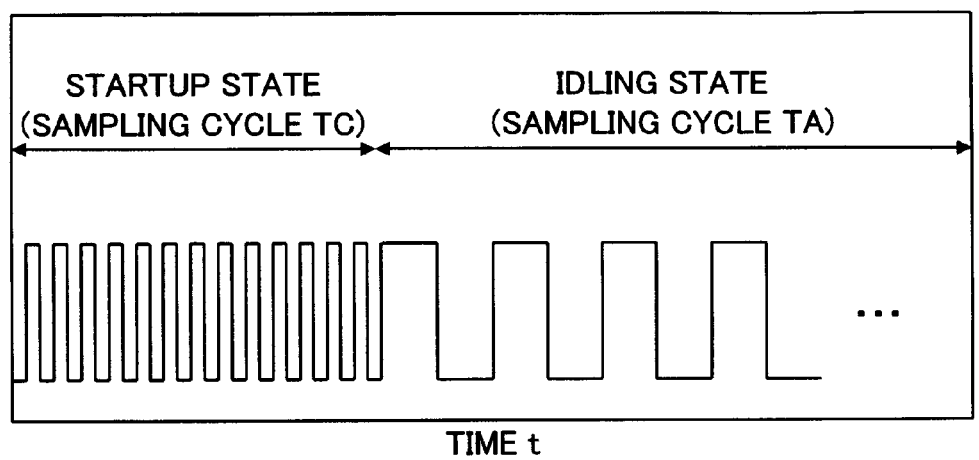
FIG. 12 is a waveform diagram, illustrating the relationship between the state assumed in the substrate processing apparatus achieved in the embodiment and the sampling cycle.

FIG. 12 presents a waveform diagram indicating the relationship between the state assumed in the substrate processing apparatus 100 and the sampling cycle with which the MCs 340A, 340B, 340C, . . . sample the measurement signals, as observed in the second embodiment. It is to be noted that FIG. 12 does not include the sampling waveform corresponding to the substrate processing execution state ST2, since it is identical to that shown in FIG. 8. As FIG. 12 indicates, the sampling means in each MC sample the measurement signals with the sampling cycle TA (e.g. 1 sec) in the idling state ST1 and sample the measurement signals with the sampling cycle TC (e.g. 100 msec), which is shorter than the sampling cycle TA when the startup state ST3 is assumed in the substrate processing apparatus. Thus, as in the substrate processing execution state, a greater volume of sampling data compared to that collected in the idling state, is obtained in the startup state in which apparatus trouble tends to occur readily, thereby assuring an improvement in the accuracy of the data analysis executed in the event of apparatus trouble.

The data sampled by the MCs 340A, 340B, 340C, . . . at the substrate processing apparatus 100 are then transmitted by the communication means 360 to the communication means 660 at the data processing apparatus 600 via the network 400. At the data processing apparatus 600, the sampling data received at the communication means 660 are sequentially stored into the data storage means 640 in step S140.

Next, in step S150, a decision is made as to whether or not to end the data collection. If it is decided in step S150 that the data collection is not to end, the operation returns to step S10, whereas if it is decided in step S150 that the data collection is to end, the sequence of data collection processing ends.

As explained earlier, an apparatus error is more likely to occur during startup of the substrate processing apparatus 100. For instance, the likelihood of a failure in cooling water or coolant supply, a failure in temperature control, a failure in the zero point adjustment for the gas flow rate control and the like is higher. For this reason, it is desirable to collect a greater volume of data from the substrate processing apparatus 100 in the startup state ST3.

Accordingly, the measurement signals are sampled with a shorter cycle when the substrate processing apparatus 100 is in the startup state ST3 compared to the sampling cycle set in correspondence to the idling state ST1. As a result, a greater volume of sampling data is collected in the startup state. This, in turn, makes it possible to analyze errors occurring in the substrate processing apparatus 100 with a high level of accuracy. Consequently, the substrate processing apparatus 100 can be started up more quickly. It is to be noted that while the sampling cycle TC selected in the startup state ST3 is equal to the sampling cycle TB set in the substrate processing execution state ST2, the sampling cycle TC may be set shorter than the sampling cycle TB. By selecting a shorter sampling cycle TC, an even greater volume of data can be collected in the startup state to assure even better data analysis accuracy.

Third Embodiment

Next, the data collection processing executed in the third embodiment of the present invention is explained in reference to drawings. In the third embodiment, a decision is made as to whether or not the substrate processing apparatus is in an error state based upon a concept that the data collected while the substrate processing apparatus 100 is in the error state are highly crucial for the data analysis. Since the decision as to whether or not the substrate processing apparatus is in the error state can be made based upon the results of data analysis, data collection processing, which includes adjustment of the sampling cycle executed in correspondence to the data analysis results, is explained in reference to the third embodiment. It is to be noted that since a substrate processing apparatus 100 and a data processing apparatus 600 in the third embodiment assume structures identical to those shown in FIGS. 1 through 4, a detailed explanation thereof is omitted.

The data analysis means 612 in the data processing apparatus 600 is able to, for instance, detect an error having occurred in the substrate processing apparatus 100, estimate the apparatus state, estimate the extent of wear of a part in the substrate processing apparatus 100 and predict wafer processing results by analyzing the sampling data stored in the data storage means 640.

If the data analysis results provided by the data analysis means 612 indicate a value exceeding a predetermined threshold value, for instance, the sampling control means 614 accesses the sampling cycle storage means 650 to read out the sampling cycle corresponding to the data analysis results and transmits a control signal to the MCs 340A, 340B, 340C, . . . as instructions for adjusting the current sampling cycle to the sampling cycle having been read out. It is to be noted that error detection results, indicating the results of error detection in the substrate processing apparatus 100, are explained in reference to the embodiment as a specific example of the data analysis results. However, the present invention may be adopted in this embodiment in conjunction with another type of data analysis results.

Sampling Cycles

The sampling cycles selected in the third embodiment are now explained in reference to a drawing. In the sampling cycle storage means 650 achieved in the third embodiment, data sampling cycles each set in correspondence to a specific state assumed in the substrate processing apparatus 100 are stored as in the first and second embodiments explained earlier. In addition, in correspondence to each of the apparatus states in which error detection is executed, i.e., the idling state ST1 and the substrate processing execution state ST2, different data sampling cycles are set for a pre-error state and a post-error state.

FIG. 13 shows a data table indicating the sampling cycle and the apparatus state, which is stored in the sampling cycle storage means 650. As shown in FIG. 13, a sampling cycle TA1 (e.g., 1 sec) is set in correspondence to a pre-error idling state ST1 and a sampling cycle TA2 (e.g., 10 msec) is set in correspondence to a post-error idling state ST1 in addition, a sampling cycle TB1 (e.g., 100 msec) is set in correspondence to a pre-error substrate processing execution state ST2, whereas a sampling cycle TB2 (e.g., 10 msec) is set in correspondence to a post-error substrate processing execution state ST2. A sampling cycle TC (e.g., 100 msec) is set in correspondence to the startup state ST3.

Specific Example of Data Collection Processing

Figure 14:
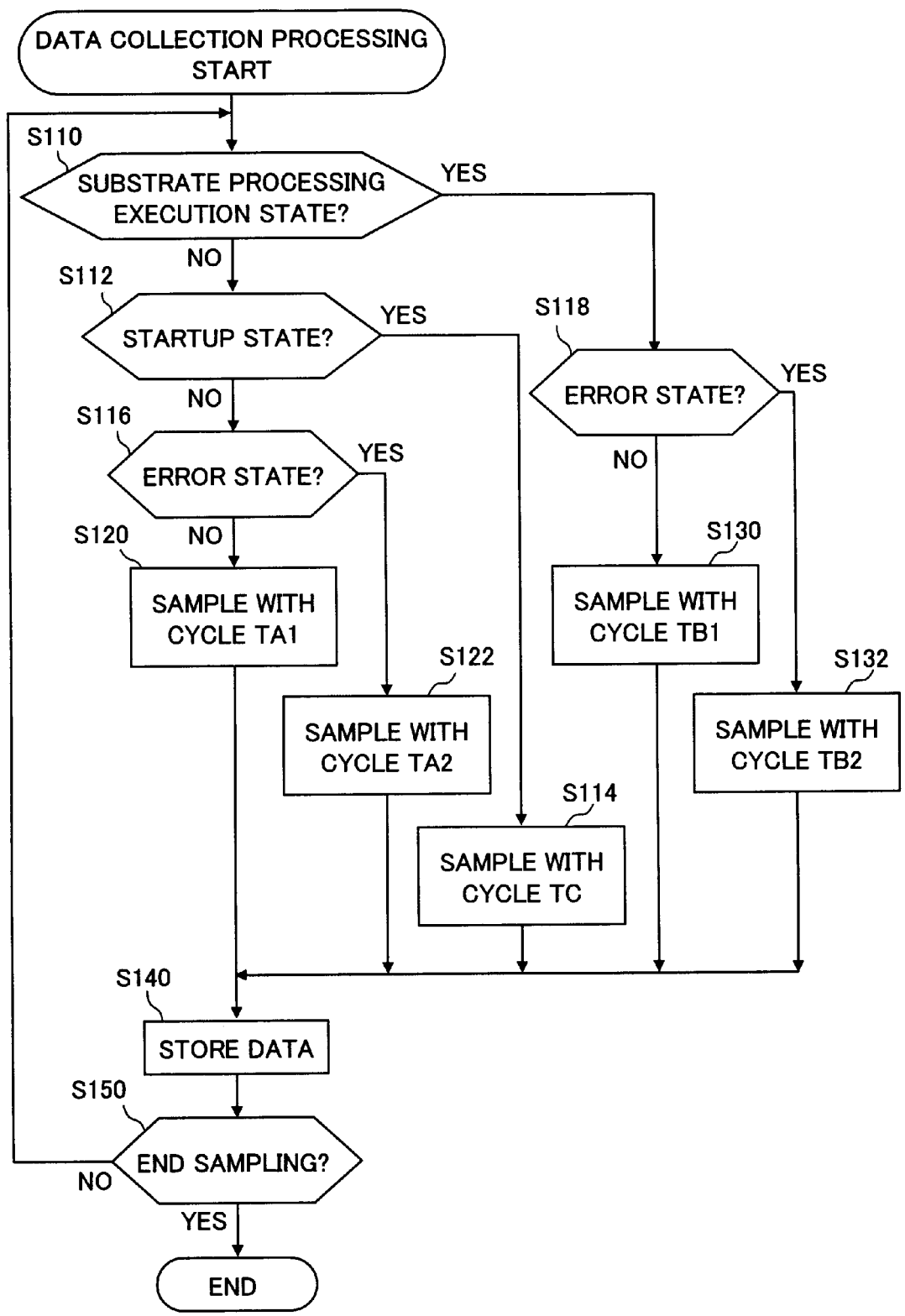
FIG. 14 presents a flowchart of an example of data collection processing that may be executed in the embodiment.

Next, a specific example of data collection processing that may be executed in the embodiment is explained in reference to drawings. FIG. 14 presents a flowchart of the specific example of the data collection processing executed in the embodiment. The data collection processing is executed by the arithmetic operation means 610 at the data processing apparatus 600 based upon a specific program. Once the data collection processing starts, the sampling control means 614 first executes control for adjusting the sampling cycle in correspondence to the state of the substrate processing apparatus 100 (steps S110, S112, S114, S116, S118, S120, S122, S130 and S132).

More specifically, a decision is made in step S110 as to whether or not the substrate processing apparatus 100 is currently in the substrate processing execution state. If it is decided in step S110 that the substrate processing apparatus is not in the substrate processing execution state, a decision is made in step S112 as to whether or not the substrate processing apparatus 100 is currently in the startup state. If it is decided in step S112 that the substrate processing apparatus is currently in the startup state, the sampling cycle storage means 650 is accessed in step S114 to read out the sampling cycle TC corresponding to the startup state ST3. Then, the sampling control means 614 transmits a control signal to the individual MCs 340A, 340B, 340C, . . . so that they sample the measurement signals obtained at the measuring instrument units 350A, 350B, 350C, . . . with the sampling cycle TC.

If, on the other hand, it is decided in step S112 that the substrate processing apparatus is not in the startup state, it is judged that the substrate processing apparatus is currently in the idling state. In this case, a decision is made in step S116 as to whether or not the substrate processing apparatus is in the error state. The decision as to whether or not the substrate processing apparatus is in the error state may be made based upon the results of error decision-making executed as part of the data analysis by the data analysis means 612. The data analysis means 612 analyzes the data stored in the data storage means by adopting the PCA method, calculates an index such as a residual sum of squares, a principal component point, a sum of squares of principal component points or the like and monitors the index to check whether or not it exceeds a predetermined threshold value. If the index indicating the data analysis results does not exceed the predetermined threshold value, the data analysis means judges that the substrate processing apparatus is not in the error state (i.e., the substrate processing apparatus is in a normal state), whereas if the index value exceeds the predetermined threshold value, it judges that the processing apparatus is in the error state. The sampling control means 614 then makes a decision as to whether or not the substrate processing apparatus is in the error state based upon the results of the decision made by the data analysis means 612 as described above.

If it is decided in step S116 that the substrate processing apparatus is currently not in the error state, the sampling cycle storage means 650 is accessed in step S120 to read out the sampling cycle TA1 corresponding to the idling state ST1. Then, the sampling control means 614 transmits a control signal to the individual MCs 340A, 340B, 340C, . . . so that they sample the measurement data obtained at the measuring instrument units 350A, 350B, 350C, . . . with the sampling cycle TA1.

If, on the other hand, it is decided in step S116 that the substrate processing apparatus is in the error state, the sampling cycle storage means 650 is accessed in step S122 to read out the sampling cycle TA2 corresponding to the post-error idling state ST1. Then, the sampling control means 614 transmits a control signal to the individual MCs 340A, 340B, 340C, . . . so that they sample the measurement data obtained at the measuring instrument units 350A, 350B, 350C, . . . with the sampling cycle TA2. In this situation, the sampling cycle is adjusted from the sampling cycle TA1 to the sampling cycle TA2, resulting in an increase in the sampling data volume.

If it is decided in step S110 that the substrate processing apparatus is in the substrate processing execution state, a decision is made in step S118 as to whether or not the substrate processing apparatus is in the error state. If it is decided in step S118 that the substrate processing apparatus is currently not in the error state, the sampling cycle storage means 650 is accessed in step S130 to read out the sampling cycle TB1 corresponding to the substrate processing execution state ST2. Then, the sampling control means 614 transmits a control signal to the individual MCs 340A, 340B, 340C, . . . so that they sample the measurement data obtained at the measuring instrument units 350A, 350B, 350C, . . . with the sampling cycle TB1.

If, on the other hand, it is decided in step S118 that an error has occurred in the substrate processing apparatus, the sampling cycle storage means 650 is accessed in step S132 to read out the sampling cycle TB2 corresponding to the post-error substrate processing execution state ST2. Then, the sampling control means 614 transmits a control signal to the individual MCs 340A, 340B, 340C, . . . so that they sample the measurement data obtained at the measuring instrument units 350A, 350B, 350C, . . . with the sampling cycle TB2. In this situation, the sampling cycle is adjusted from the sampling cycle TB1 to the sampling cycle TB2, resulting in an increase in the sampling data volume.

Figure 15:
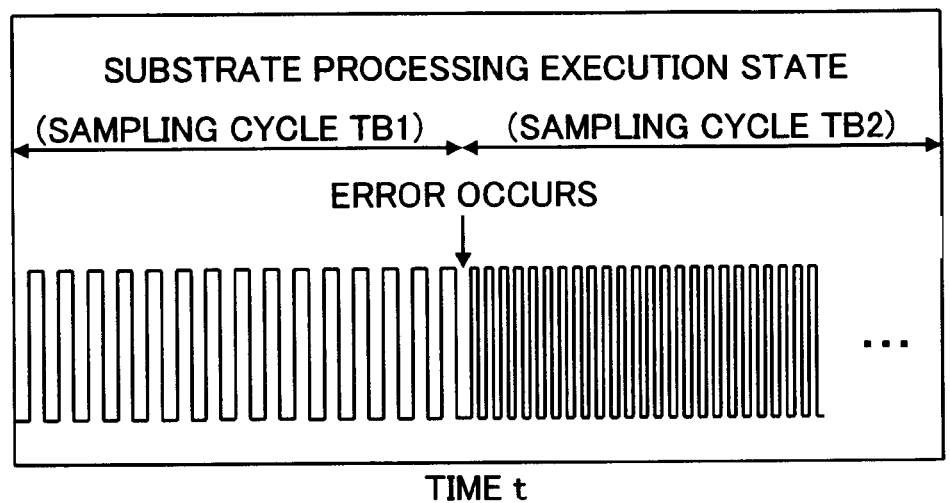
FIG. 15 is a waveform diagram, illustrating the relationship between the state assumed in the substrate processing apparatus achieved in the embodiment and the sampling cycle.

FIG. 15 presents a waveform diagram indicating a change in the sampling cycle with which the data are sampled by the MCs 340A, 340B, 340C, . . . if an error occurs in the substrate processing apparatus 100 in the substrate processing execution state ST2. It is to be noted that the sampling cycle is switched in a manner similar to that shown in FIG. 15 if an error occurs in the substrate processing apparatus 100 in the idling state ST1, and that a separate waveform corresponding to the idling state ST1 is not provided. As FIG. 15 indicates, the MCs 340A, 340B, 340C, . . . controlled by the sampling control means 614, sample the measurement data with the sampling cycle TB1 (e.g., 100 msec) in the substrate processing execution state ST2 as long as the substrate processing apparatus 100 remains error free, but once an error occurs in the substrate processing apparatus 100, they sample the measurement data with the sampling cycle TB2 (e.g., 10 msec), shorter than the other sampling cycle TB1. The volume of sampling data collected under these circumstances increases by a factor of 10 per unit time.

The data sampled by the MCs 340A, 340B, 340C, . . . of the substrate processing apparatus 100 are then transmitted by the communication means 360 to the communication means 660 at the data processing apparatus 600 via the network 400. At the data processing apparatus 600, the sampling data received at the communication means 660 are sequentially stored into the data storage means 640 in step S140.

Next, in step S150, a decision is made as to whether or not to end the data collection. If it is decided in step S150 that the data collection is not to end, the operation returns to step S10, whereas if it is decided in step S150 that the data collection is to end, the sequence of data collection processing ends.

It is to be noted that while the third embodiment has been described by quoting an example in which the data stored in the data storage means 640 are analyzed, a decision is made as to whether or not the substrate processing apparatus 100 is in the error state based upon the analysis results and the sampling cycle is adjusted based upon the decision results, the data stored in the data storage means 640 may be analyzed, the state of the substrate processing apparatus 100 may be estimated based upon the analysis results and the sampling cycle may be adjusted based upon the estimate results.

More specifically, the data analysis means 612 may analyze the data stored in the data storage means 640 by adopting the PLS method described earlier or the like, and estimate the extent of wear of a part (e.g., the upper electrode or the focus ring) disposed inside the processing chamber based upon the analysis results. Then, a decision may be made as to whether or not the apparatus is in a part worn state by judging whether or not the estimated extent of wear exceeds a predetermined threshold value. If the estimated extent of wear exceeds the threshold value, a sampling cycle, shorter than that selected when the estimated extent of wear does not exceed the threshold value, may be selected so as to increase the data volume.

In such a case, a decision should be made in, for instance, step S116 in FIG. 14, as to whether or not the substrate processing apparatus is in the part worn state in addition to the decision as to whether or not the substrate processing apparatus is in the error state. Then, if the estimated extent of wear does not exceed the predetermined threshold value, the sampling cycle TA1 is selected in step S120, whereas if the substrate processing apparatus is judged to be in the part worn state, i.e., if the estimated extent of wear exceeds the threshold value, the sampling cycle is set to TA2 in step S122. In addition, in step S118 in FIG. 14, too, a decision is made as to whether or not the substrate processing apparatus is in the part worn state, as in step S116. As a result, the volume of data collected when the substrate processing apparatus 100 is in the part worn state, as well as when the substrate processing apparatus 100 is in the error state, can be increased.

As explained above, it is desirable to assure better analysis result accuracy by collecting a greater volume of data from the substrate processing apparatus 100 whenever the data analysis results provided by the data analysis means 612 indicate a value exceeding a predetermined threshold value. For instance, provided that the data analysis is executed to detect an error in the substrate processing apparatus 100, estimate the state of the substrate processing apparatus 100 or predict the wafer processing results, the state of the substrate processing apparatus 100 can be judged with a higher level of accuracy based upon more accurate data analysis results. If the data analysis is executed to estimate the extent of wear of a part in the substrate processing apparatus 100, the optimal part replacement timing can be determined with a higher level of accuracy based upon more accurate data analysis results. In addition, if the data analysis is executed to predict the wafer processing results, the processing results can be predicted with a higher level of accuracy based upon more accurate data analysis results, which, in turn, enables optimal monitoring of the operation of the substrate processing apparatus 100, leading to an improvement in the production yield of wafers W.

In the embodiment, the sampling cycle is adjusted based upon the data analysis results. More specifically, if the data analysis results indicate a value exceeding the predetermined threshold value, the sampling cycle is shortened so as to collect a greater volume of sampling data. Thus, the accuracy of the data analysis executed after the data analysis results exceed the predetermined threshold value can be further improved. Consequently, a high level of accuracy achieved in the estimate of the state of the substrate processing apparatus 100, the estimate of the extent of part wear and the prediction of the wafer processing results.

It is to be noted that while a single threshold value is set to be applied in conjunction with the data analysis results and the sampling cycle is adjusted by judging whether or not the data analysis results indicate a value exceeding the threshold value in the embodiment, a plurality of threshold values may be set so as to adjust the sampling cycle each time the data analysis results exceed one of the threshold values. In such a case, a shorter sampling cycle can be set as the error level in the substrate processing apparatus 100 increases so as to enable more detailed investigation of the error cause, for instance.

Fourth Embodiment

Next, the data collection processing executed in the fourth embodiment of the present invention is explained in reference to a drawing. In the fourth embodiment described below, the cycle with which the measurement signals obtained from each of the processing chambers 200A~200D in, for instance, the substrate processing apparatus 100 in FIG. 1 is set independently.

FIG. 16 shows a data table indicating the relationship between the sampling cycle and the apparatus state, which is stored in the sampling cycle storage means 650. In the data table shown in FIG. 16, the relationship between the sampling cycle and the apparatus state is stored in correspondence to each of the processing chambers 200A~200D.

For instance, in correspondence to the processing chamber 200A, a sampling cycle TAA1 (e.g., 1 sec) is set for a pre-error idling state ST1 and a sampling cycle TAA2 (e.g., 10 msec) is set for a post-error idling state ST1. In addition, a sampling cycle TAB1 (e.g., 100 msec) is set in correspondence to a pre-error substrate processing execution state ST2, whereas a sampling cycle TAB2 (e.g., 10 msec) is set for a post-error substrate processing execution state ST2. A sampling cycle TAC (e.g., 100 msec) is set in correspondence to the startup state ST3.

In correspondence to the processing chamber 200B, too, sampling cycles TBA1, TBA2, TBB1, TBB2 and TBC are set in a similar manner. Likewise, sampling cycles TCA1, TCA2, TCB1, TCB2 and TCC are set for the processing chamber 200C, whereas sampling cycles TDA1, TDA2, TDB1, TDB2 and TDC are set for the processing chamber 200D.

While identical processing may be executed in all the processing chambers 200A~200D in the substrate processing apparatus 100, it is also conceivable that different types of processing are executed in the individual processing chambers. For instance, wafers W may be etched in the processing chambers 200A and 200B, whereas film formation processing may be executed in the processing chambers 200C and 200D. Under such circumstances, if the measurement signals obtained from all the processing chambers are sampled with a fixed sampling cycle, an excessively large volume of sampling data, more than necessary to assure accurate data analysis results, or a very small volume of sampling data not enough to assure accurate data analysis results, may be collected from a given processing chamber. In addition, if an excessively large volume of sampling data is collected in correspondence to a processing chamber, the storage capacity in the data storage means 640 is bound to become depleted faster and, at the same time, the data analysis is bound to become more time-consuming. If, on the other hand, the volume of sampling data collected in correspondence to a given processing chamber is insufficient, accurate data analysis results will not be obtained for the processing chamber.

In the embodiment, the sampling cycle can be set in correspondence to each processing cycle, which allows the absolute minimum volume of data needed for the data analysis to be collected in correspondence to the type of processing executed in the particular processing chamber. As a result, more accurate analysis results can be achieved efficiently while minimizing wasteful use of the storage capacity in the data storage means 640.

While an explanation is given above in reference to the fourth embodiment on an example in which the sampling cycle is set in correspondence to each of the processing chambers 200A~200D, the sampling cycle may instead be set in correspondence to each of the modules other than the processing chambers, e.g., the transfer chamber 130, the orienter 136, the common transfer chamber 150 and the loadlock chambers 160M and 160N.

It is to be noted that the substrate processing apparatus 100 described above alone may be connected with the network 400, or a plurality of substrate processing apparatuses, similar to the substrate processing apparatus 100, may also be connected with the network 400. Furthermore, another type of substrate processing apparatus, such as a heat treatment apparatus or a sputtering apparatus, may also be connected with the network 400.

The data processing apparatus 600 may be constituted with, for instance, an advanced group controller (hereafter referred to as an "AGC") so as to execute the data collection processing for the individual substrate processing apparatus is via the AGC. It is to be noted that in addition to the data collection processing, the AGC may be engaged in centralized management or the like of recipes (process condition values) used in the individual substrate processing apparatus is 100. The AGC may be constituted with a single computer or it may be constituted with a plurality of computers. In addition, the AGC may adopt a decentralized structure in which a server and a client are assigned to fulfill different functions.

It is to be noted that the communication means 360 of the substrate processing apparatus 100 may be constituted as an RAP (remote agent protocol), i.e., a logical interface with the AGC, which exchanges various types of data with the AGC via the network 400.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, the sampling cycle may be adjusted in the first through fourth embodiment in correspondence to each measurement signal type (e.g., the parameter signals, the optical signals or the electrical signals). In such a case, even finer sampling control is assured to further reduce wasteful use of the storage capacity in the data storage means 640.

In addition, while an explanation is given above in reference to the first through fourth embodiment on an example in which the sampling cycles are stored in advance in a table format in the sampling cycle storage means 650, the sampling cycles stored in the data storage means 640 may be dynamically updated in correspondence to the total storage capacity of the data storage means 640 or the available storage area in the data storage means 640.

Furthermore, while the sampling control means 614 is provided as part of the data processing apparatus 600 in the first through fourth embodiment described above, the present invention is not limited to this example and the sampling control means 614 may instead be installed in the control unit 300 of the substrate processing apparatus 100.

What is claimed is:

1. A data collection method to be adopted in a substrate processing apparatus that includes a processing chamber where a specific type of processing is executed on a processing target substrate such that the method collects data provided by a plurality of measuring instruments disposed, at least, in said processing chamber, the method comprising:
   a step in which measurement data are obtained from said measuring instruments with a predetermined sampling cycle and are stored into a data storage means,
   wherein said sampling cycle is adjusted based upon the state of said substrate processing apparatus,
   wherein a decision is made as to whether or not said substrate processing apparatus is in a substrate processing execution state,
   wherein if the state assumed by said substrate processing apparatus is judged not to be said substrate processing execution state, said sampling cycle is lengthened by the sampling control means relative to said sampling cycle set in said substrate processing execution state, and
   wherein when said substrate processing apparatus is judged by the sampling control means not to be in said substrate processing execution state, a sampling cycle, which is at least equal to or shorter than said sampling cycle set in said substrate processing execution state, is selected if said substrate processing apparatus is in an apparatus startup state.

2. A data collection method to be adopted in a substrate processing apparatus that includes a processing chamber where a specific type of processing is executed on a processing target substrate and collects data provided by a plurality of measuring instruments disposed, at least, in said processing chamber, comprising:
   a step in which measurement data are obtained from said measuring instruments with a predetermined sampling cycle and are stored into a data storage means,
   wherein said measurement data stored in said data storage means are analyzed, the state of said substrate processing apparatus is estimated based upon the analysis results and said sampling cycle is adjusted based upon the estimate results,
   wherein said measurement data stored in said data storage means are analyzed to estimate the extent of wear of a part disposed within said processing chamber based upon the analysis results, and a decision is made as to whether or not the estimated wear extent exceeds a predetermined threshold value, and if the wear extent is determined to exceed said threshold value, said sampling cycle is shortened relative to said sampling cycle set when the wear extent does not exceed said threshold value.

3. A substrate processing apparatus that includes a processing chamber where a specific type of processing is executed on a processing target substrate, comprising:
   a plurality of measuring instruments disposed, at least, in said processing chamber;

a sampling means for obtaining measurement data from said measuring instruments with a predetermined sampling cycle;

a data storage means for storing said measurement data;

a sampling cycle storage means for storing in advance sampling cycles each corresponding to one of various states assumed by said substrate processing apparatus; and a sampling control means for executing control whereby said sampling cycle is adjusted to a sampling cycle obtained from said sampling cycle storage means based upon the state currently assumed by said substrate processing apparatus, wherein the sampling control means makes a decision as to whether or not said substrate processing apparatus is in a substrate processing execution state; and if the state assumed by said substrate processing apparatus is judged not to be said substrate processing execution state, said sampling cycle is lengthened relative to said sampling cycle set in said substrate processing execution state, and wherein when said substrate processing apparatus is judged not to be in said substrate processing execution state, a sampling cycle, which is at least equal to or shorter than said sampling cycle set in said substrate processing execution state, is selected if said substrate processing apparatus is in an apparatus startup state.

4. A substrate processing apparatus that includes a processing chamber where a specific type of processing is executed on a processing target substrate, comprising:

a plurality of measuring instruments disposed, at least, in said processing chamber;

a sampling means for obtaining measurement data from said measuring instruments with a predetermined sampling cycle;

a data storage means for storing said measurement data;

a data analysis means for analyzing said measurement data stored in said data storage means; and a sampling control means for executing control so as to adjust said sampling cycle based upon the analysis results provided by said data analysis means, wherein the data analysis means for analyzing said measurement data stored in the data storage means analyzes said stored data to estimate the extent of wear of a part disposed within said processing chamber based upon the analysis results and a decision is made as to whether or not the estimated wear extent exceeds a predetermined threshold value, and if the wear extent is determined to exceed said threshold value, said sampling cycle is shortened relative to said sampling cycle set when the wear extent does not exceed said threshold value.

* * * * *